(12) United States Patent
Kawase

(10) Patent No.: US 8,093,656 B2
(45) Date of Patent: Jan. 10, 2012

(54) ELECTROOPTICAL DEVICE AND ELECTRONIC EQUIPMENT HAVING RESIN FILM IN LIGHT EMITTING REGION AND SEALING REGION

(75) Inventor: Tomomi Kawase, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 758 days.

(21) Appl. No.: 11/902,276

(22) Filed: Sep. 20, 2007

(65) Prior Publication Data

US 2008/0067595 A1     Mar. 20, 2008

Related U.S. Application Data

(62) Division of application No. 10/229,048, filed on Aug. 28, 2002, now Pat. No. 7,333,167.

(30) Foreign Application Priority Data

Aug. 29, 2001   (JP) .................................. 2001-260121

(51) Int. Cl.
*H01L 31/00* (2006.01)

(52) U.S. Cl. ........ 257/350; 313/506; 313/112; 313/E31; 349/106; 349/110; 349/153

(58) Field of Classification Search .................. 257/350, 257/E31.001; 349/106, 110, 153; 313/506
See application file for complete search history.

(56) References Cited

U.S. PATENT DOCUMENTS

| 5,513,028 | A | 4/1996 | Sono et al. |
| 5,684,551 | A | 11/1997 | Nakamura et al. |
| 5,898,208 | A | 4/1999 | Miyazaki et al. |
| 5,916,735 | A | 6/1999 | Nakashima et al. |
| 6,057,900 | A | 5/2000 | Ono et al. |
| 6,087,196 | A | 7/2000 | Sturm et al. |
| 6,124,917 | A | 9/2000 | Fujioka et al. |
| 6,127,072 | A | 10/2000 | Shiba et al. |
| 6,143,450 | A | 11/2000 | Sobue et al. |
| 6,392,340 | B2 * | 5/2002 | Yoneda et al. ................ 313/506 |
| 6,400,438 | B1 | 6/2002 | Noritake et al. |
| 6,414,733 | B1 | 7/2002 | Ishikawa et al. |
| 6,624,572 | B1 | 9/2003 | Kim et al. |
| 6,734,931 | B2 | 5/2004 | Yu |
| 6,863,961 | B2 | 3/2005 | Miyashita et al. |

FOREIGN PATENT DOCUMENTS

| EP | 0 880 303 A1 | 11/1998 |
| EP | 0 902 315 A2 | 3/1999 |
| EP | 1 003 065 A2 | 5/2000 |
| EP | 1 061 383 A1 | 12/2000 |

(Continued)

*Primary Examiner* — Cuong Q Nguyen
*Assistant Examiner* — Tran Tran
(74) *Attorney, Agent, or Firm* — Oliff & Berridge, PLC

(57) ABSTRACT

The present invention provides a color filter substrate that can include color filters 12, which are formed in at least a display region and each of which are composed of colored portions, and a light shielding layer on a substrate main body. The light shielding layer can be formed on the approximately entire surface of a color filter non-forming region, in addition to the display region. Further, the colored portions can be formed by an inkjet method, and the color filter substrate can further include a resin member for partitioning pixels for forming the respective colored portions, and the resin member can be formed on the approximately entire surface of the color filter non-forming region, in addition to along the peripheries of the respective colored portions.

3 Claims, 14 Drawing Sheets

FOREIGN PATENT DOCUMENTS

| | | |
|---|---|---|
| JP | A-03-039957 | 2/1991 |
| JP | A-05-241153 | 9/1993 |
| JP | A-06-118217 | 4/1994 |
| JP | A-07-235378 | 9/1995 |
| JP | A-10-012377 | 1/1998 |
| JP | A-10-153967 | 6/1998 |
| JP | A-11-040358 | 2/1999 |
| JP | A-11-054270 | 2/1999 |
| JP | 11-084121 | 3/1999 |
| JP | A-2001-188117 | 7/2001 |

* cited by examiner

Fig. 7
(a)
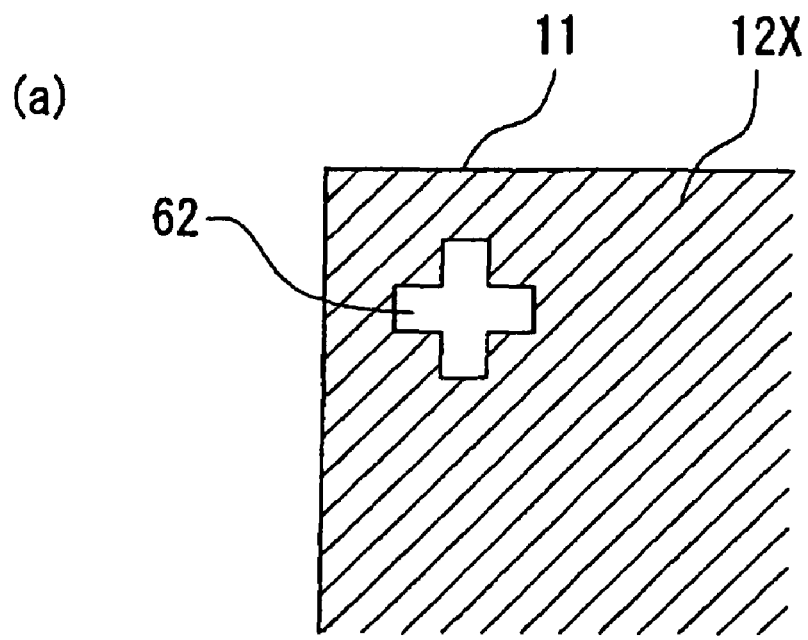
(b)
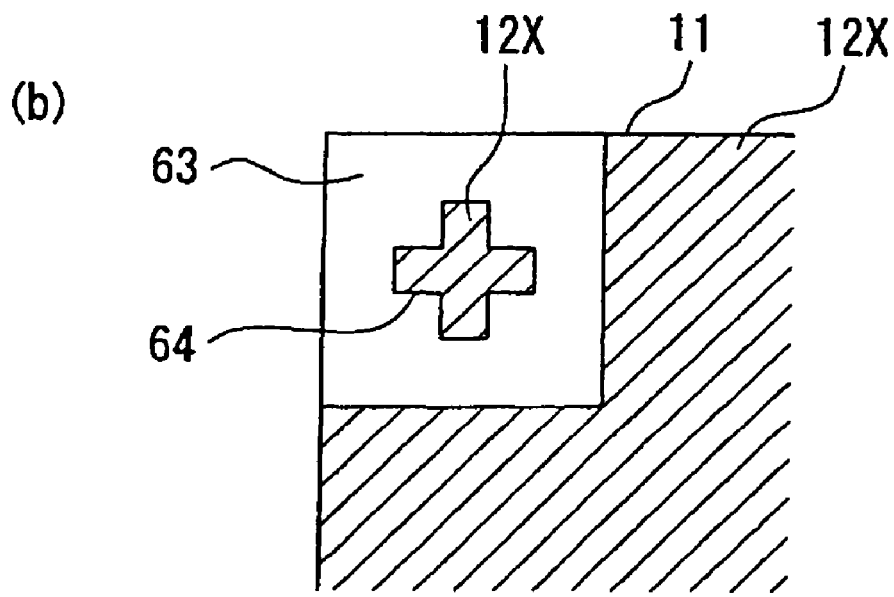

Fig. 14
(a)
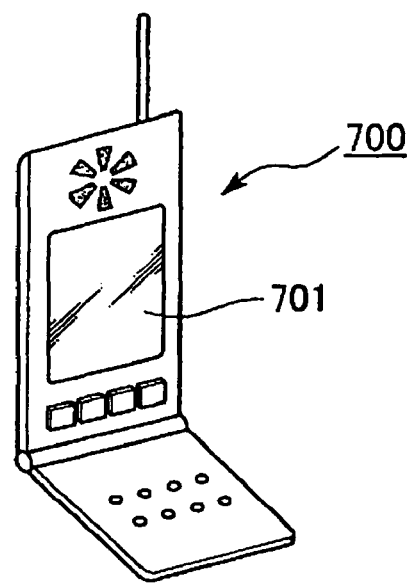
(b)
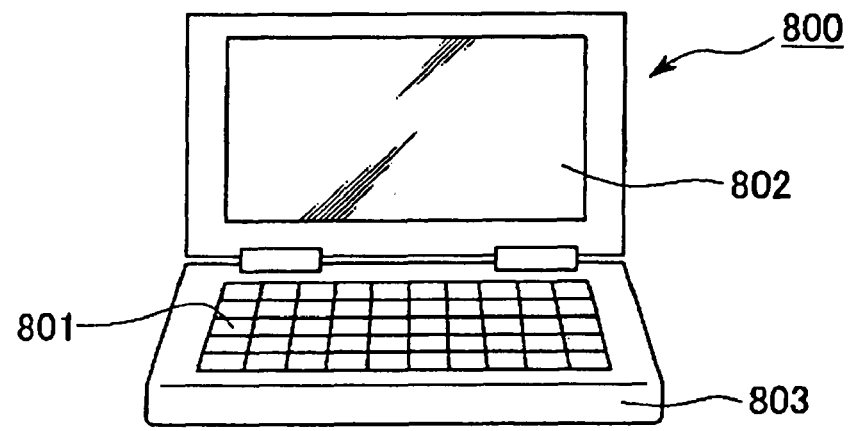
(c)
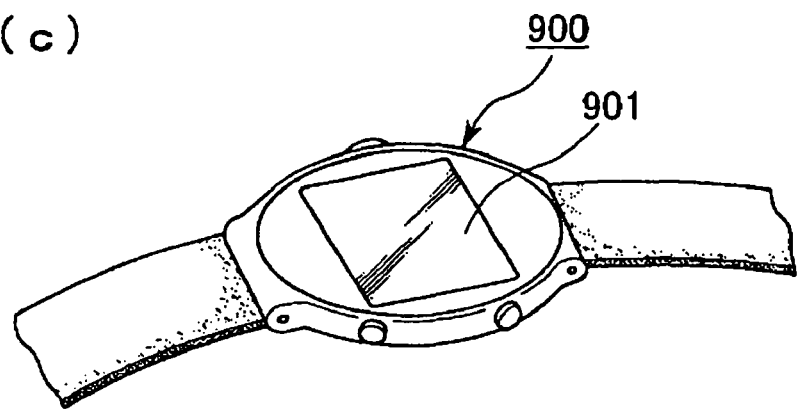

ELECTROOPTICAL DEVICE AND ELECTRONIC EQUIPMENT HAVING RESIN FILM IN LIGHT EMITTING REGION AND SEALING REGION

This is a Division of application Ser. No. 10/229,048 filed Aug. 28, 2002, which claims the benefit of Japanese Patent Publication No. 2001-260121 filed Aug. 29, 2001. The disclosures of the prior applications are hereby incorporated by reference herein in their entirety.

BACKGROUND OF THE INVENTION

1. Field of Invention

The present invention relates to a color filter substrate having color filters on a substrate main body, an electroluminescence substrate having electroluminescence elements on a substrate main body, and an electrooptical device having the color filter substrate or the electroluminescence substrate, as well as to electronic equipment having the electrooptical device.

2. Description of Related Art

Currently, a liquid crystal device that can be used as a direct viewing type display device mounted on electronic equipment, such as a mobile phone, is mainly composed of a pair of substrates disposed in confrontation with each other with a liquid crystal layer held therebetween and having electrodes for applying a voltage to the liquid crystal layer. Further, a liquid crystal device having color filters disposed on one of substrates to perform a full color display has been widely used.

An example of such a conventional liquid crystal device having color filters will be explained with reference to a passive matrix type transmissive liquid crystal device based on FIG. 10. FIG. 10 shows a fragmentary sectional view showing a structure of the exemplary conventional liquid crystal device. The conventional transmissive liquid crystal device shown in FIG. 10 is schematically arranged such that a color filter substrate 200 and a confronting substrate 300, which act as a pair of substrates, are disposed in confrontation with each other with a liquid crystal layer 400 held therebetween. The color filter substrate 200 is bonded to the confronting substrate 300 at the respective peripheral edges thereof through a seal member 500.

The color filter substrate 200 is schematically arranged such that color filters 220, an overcoat layer 230, transparent electrodes 240, and an orientation film 250 are sequentially laminated on the surface of a substrate main body 210 on the liquid crystal layer 400 side thereof. The confronting substrate 300 is schematically arranged such that transparent electrodes 320 and an orientation film 330 are sequentially laminated on the surface of a substrate main body 310 on the liquid crystal layer 400 side thereof.

The plurality of transparent electrodes 240 are disposed on the color filter substrate 200 and the plurality of transparent electrodes 320 are disposed on the confronting substrate 300 in a stripe shape. The respective transparent electrodes 240 and the respective transparent electrodes 320 extend in directions which intersect each other. Then, the regions, where the respective transparent electrodes 240 intersect the respective transparent electrodes 320, are arranged as respective pixels, and each color filter 220 has red (R), green (G), and blue (B) colored portions 220R, 220G, and 220B formed thereto in a predetermined pattern in correspondence to the respective pixels. Further, light shielding layers 220X are formed between the adjacent pixels on the color filter substrate 200.

While the color filters 220 are formed in a display region 610, located at least inside the inner end surface of the seal member 500, there can exist cases in which they are formed only in the display region 610 and a case in which they are additionally formed outside the display region 610 by several pixels. FIG. 10 shows the case in which the color filters 220 are additionally formed outside the display region 610 by the several pixels. Further, a color filter forming region is denoted by reference numeral 600. It should be noted that, while the width of the colored portions 220R to 220B is shown in enlargement in the figure, actually, the width of them is very minute and set to about 0.15 to 0.3 mm, whereas the interval between the inner end surface of the seal member 500 and the display region 610 or the color filter forming region 600 is set to about 0.2 to 3 mm which is relatively larger than the width of the colored portions 220R to 220B.

Accordingly, in the conventional transmissive liquid crystal device, a region where the color filters 220 are not formed inevitably exists at the peripheral edge of the region, which is located inside the seal member 500 and in which the liquid crystal layer 400 is enclosed. This can be true not only in the case in which the color filters 220 are formed only in the display region 610, but also in the case in which the color filters 220 are additionally formed outside the display region 610 by the several pixels. Thus, as shown in the figure, a step, which corresponds to the height (0.7 to 3 μm) of the color filters 220, can be formed on the surface of the color filter substrate 200 along the boundary between the color filter forming region 600 and the color filter non-forming region (outside the forming region 600).

In contrast, recently, there have been developed technologies for an electroluminescence device acting as a display device making use of electroluminescence elements. With respect to an organic electroluminescence (EL) element using an organic material as a light emitting material, there have been mainly reported a method of forming a low molecular organic EL element (light emitting material) to a film by vapor deposition as shown on page 913 of Appl. Phis. Lett. 51(12), Sep. 21, 1987 and a method of coating a high molecular organic EL element as shown on page 34 of Appl. Phys. Lett. 71(1), Jul. 7, 1997, both articles being incorporated herein by reference in their entirety.

As a coloring device, a method of vapor depositing different light emitting materials on desired pixels through a mask is executed in the low molecular material. In contrast, as to the high molecular material, attention is paid to colorization by minute patterning using an inkjet method. The following examples are known as to the formation of organic EL elements using an inkjet method. That is, they are Japanese Unexamined Patent Application Publications Nos. 7-235378, 10-12377, 10-153967, 11-40358, 11-54270, 3-39957, and U.S. Pat. No. 6,087,196.

SUMMARY OF THE INVENTION

Incidentally, in general, when a display device, such as a liquid crystal device and an organic EL element is mounted on electronic equipment, such as a mobile phone, the display screen of the electronic equipment is set about 0.5 to 3 mm wider than the display region of the display device. Accordingly, display can be performed without any problem even if the display region of the display device is somewhat dislocated from the display screen of the electronic equipment exposed from the window of the case of the electronic equipment.

Accordingly, when the display device is mounted on the electronic equipment, such as a mobile phone, the non-display region of the display device which is located in the vicinity of display region, is located in the vicinity of the peripheral edge of the display screen. Thus, a parting member for shielding the non-display region from light is attached to the electronic equipment having the display device mounted thereof to prevent the non-display region of the display device from being observed by an observer. As described above, since the parting member is conventionally disposed independently of the other elements constituting the display device, a process for attaching the parting member is additionally required, from which problems can arise that the number of the processes for manufacturing the electronic equipment is increased.

Further, the parting member is made by coating a black pigment on a resin molded member. However, since a cost for coating the black pigment on the resin molded member is expensive, problems can arise that the manufacturing cost of the electronic equipment is increased.

Further, since a mounting accuracy is limited when the parting member is attached to the electronic equipment, a margin of about ±0.1 to 2 mm must be provided so that display can be performed without any problem even if the inner end of the parting member is somewhat dislocated from the outer end of the display region of the display device, from which a problem is arisen in that the area of the display region of the electronic equipment (display device) is reduced by the margin.

Further, as described above, the step corresponding to the height of the color filters can be formed on the surface of the color filter substrate constituting the conventional liquid crystal device shown in FIG. 10 along the boundary between the color filter forming region and the color filter non-forming region. Therefore, in the region which is located inside of the seal member and in which the liquid crystal layer is enclosed, the cell gap of the color filter non-forming region is larger than the cell gap of the color filter forming region including the display region by the step. The cell gap of the display region can be around several microns to ten microns, whereas the thickness of the color filters is about 0.7 to 3 μm. Accordingly, the difference between the cell gap in the color filter forming region and the cell gap in the color filter non-forming region is not negligible. Thus, there is also a problem that the height of the seal depends on the thickness of the color filters.

In a liquid crystal device using an STN (super twisted nematic) type liquid crystal, a light transmittance varies in accordance with the change of a $\Delta n \cdot d$ value (where, $\Delta n$ shows the double refraction factor of a liquid crystal, and d shows a cell gap). Thus, when there is a difference in the cell gap between the color filter forming region and the color filter non-forming region, different light transmittances are exhibited in these regions. While a color filter non-forming region belongs to the non-display region, there is a possibility that the light transmittance of the color filter non-forming region slightly affects the light transmittance of the peripheral edge of the display region, that is, the display region which is located in the vicinity of the non-display region. Then, when the light transmittance of the color filter non-forming region affects the light transmittance of the peripheral edge of the display region, the brightness of the peripheral edge of the display region is changed. Thus, there is a possibility that a contract is reduced and display quality is deteriorated.

It should be noted that while the above problems are particularly outstanding in a passive matrix type liquid crystal device in which light transmittance is greatly affected by cell gaps, they may occur in any liquid crystal devices.

The transparent electrodes are formed on the color filter in the color filter substrate constituting the conventional liquid crystal device shown in FIG. 10. However, since the thickness of the transparent electrodes is as thin as about 0.1 to 0.2 μm, when a step is formed between the color filter forming region and the color filter non-forming region on the surface of the color filter substrate, there is also a possibility that the transparent electrodes (or lead wirings connected to one ends of the transparent electrodes) are broken at the step.

Note that while the electrodes are formed on the color filters in a passive matrix type liquid crystal device as shown in FIG. 10, wirings such as data lines and scan lines instead of the electrodes may be formed on the color filters in an active matrix type liquid crystal device using TFT elements and TFD elements as switching elements. In this case, there is also a possibility that the wirings such as data lines and scan lines (or lead wirings connected to the one ends of the wirings such as data lines and scan lines) are broken at the step.

The above problems caused by the step formed between the color filter forming region and the color filter non-forming region can be remedied by reducing the thickness of the color filters. However, when the thickness of the color filters is reduced, the concentration of coloring materials contained in colored portions must be increased. However, the reduction of the thickness of the color filters is difficult because it can be technically difficult to thinly and uniformly coat a resist of high concentration.

Further, alignment marks, which are used when the color filters or the organic EL elements are made by an inkjet method, must be formed separately from inter-pixel partition members, from which a problem is arisen in that the number of processes is increased.

The present invention was made in view of the above circumstances, and a first object of the present invention is to provide a technique capable of forming a parting member and the other components constituting a display device in one process and reducing a manufacturing cost of electronic equipment, as well as increasing the area of the display region of the electronic equipment. A second object of the present invention is to provide a technique capable of more flattening the surface of a color filter substrate than that of a conventional color filter substrate and arranging cell gaps uniformly as well as preventing electrodes, wirings, and the like formed on color filters from being broken. A third object of the present invention is to provide a technique capable of reducing the number of processes by forming alignment marks simultaneously with the patterning of partition members.

BRIEF DESCRIPTION OF THE DRAWINGS

The invention will be described with reference to the accompanying drawings, wherein like numerals reference like elements, and wherein:

FIGS. 7(a), (b) are enlarged plan views showing a corner portion of the color filter substrate included in the transmissive liquid crystal device of the first embodiment according to the present invention;

FIG. 14(a) is a view showing an example of a mobile phone including a transmissive liquid crystal device of any of the above embodiments, FIG. 14(b) is a view showing an example of a mobile information processing apparatus including a transmissive liquid crystal device of any of the above embodiments, and FIG. 14(c) is a view showing an example of a wrist watch type electronic equipment including a transmissive liquid crystal device of any of the above embodiments.

DETAILED DESCRIPTION OF PREFERRED EMBODIMENTS

Figure 1:
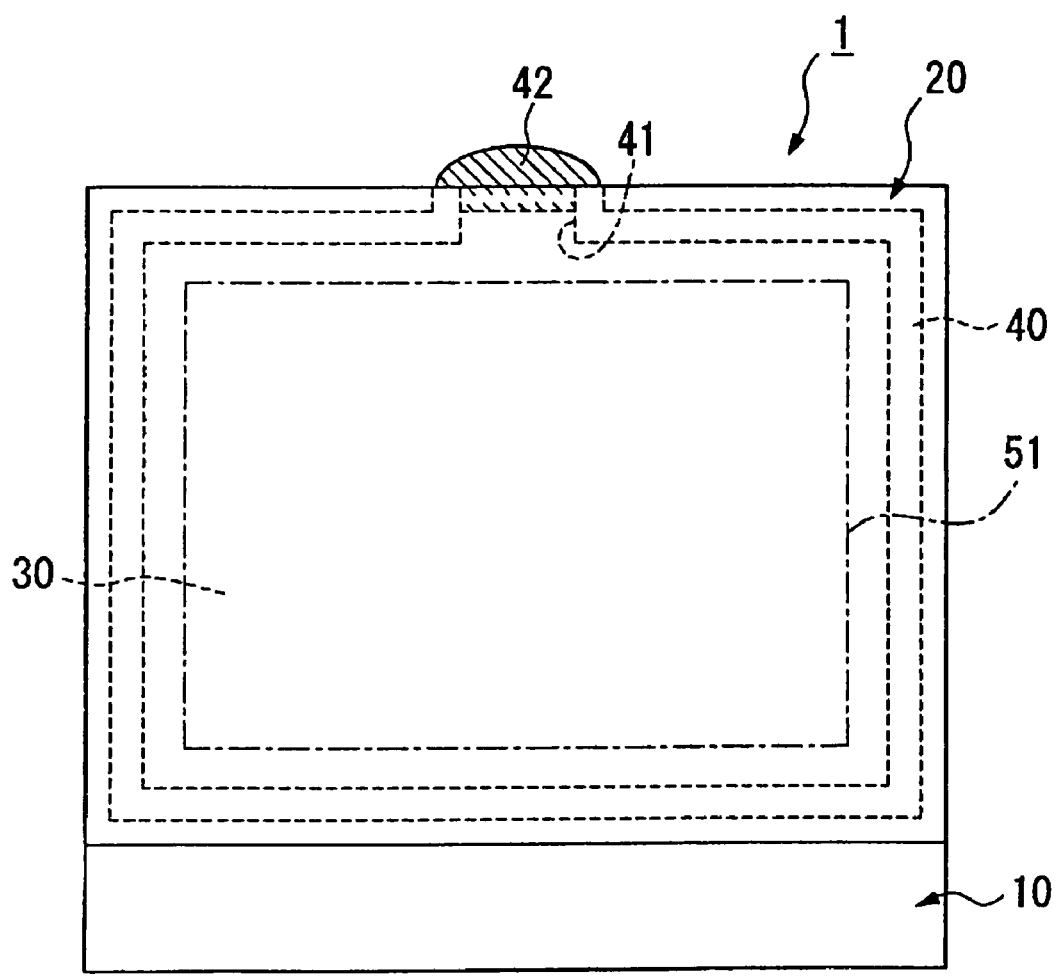
FIG. 1 is a plan view of a transmissive liquid crystal device of a first embodiment according to the present invention when it is viewed from a confronting substrate side.

To solve the above problems, the present invention provides an electrooptical device composed of a pair of confronting substrates having electrodes on the inner surfaces of the substrates and an electrooptical material held therebetween. The pair of substrates can be bonded by a seal formed on the inner surfaces of the substrates, and at least one of the pair of substrates is a color filter substrate having a plurality of color filters formed in a region surrounded by a seal portion in which the seal is formed. The electrooptical device is characterized in that a resin film can be formed on the substrate described above in the region where the seal portion is formed, as well as in the region surrounding the entire peripheries of the color filters.

Further, the color filter substrate has alignment marks formed of the resin film, the resin film can have a film thickness from 0.5 μm to 5 μm. Also, the resin film can be provided to partition the sections in which respective color filter portions are formed when the color filters are formed by an inkjet method and the resin film can be formed of a material having liquid repellency with respect to a liquid material that forms the color filters. Additionally, the resin film can be formed of a material having a light shielding property, and the resin film is formed of a material having an electric insulating property. The seal is formed of a material containing particles for keeping a gap between the pair of substrates constant and an adhesive for bonding the pair of substrate, and electronic equipment can be provided with the electrooptical device.

Further, the present invention can include an electrooptical device composed of electroluminescence elements on a substrate, each having a light emitting layer between electrodes. The electrooptical device can include a resin film that is formed in a light emitting region composed of the plurality of light emitting layers so as to surround the peripheries of the respective light emitting layers and the resin film is formed on the substrate in the region except the light emitting region.

Additionally, alignment marks can be formed of the material of the resin film in the region except the light emitting region. The resin film is formed of a material having an electric insulating property. The electroluminescence elements are formed of an organic material. Further, electronic equipment can be characterized by being provided with the electrooptical device.

Next, the embodiments according to the present invention will be described in detail. Note that while the respective embodiments are described with reference to the figures, respective layers and respective components are shown by a different reduction scale in the respective figures so that they are shown in recognizable sizes on the figures.

A structure of an electrooptical device of a first embodiment according to the present invention will be described. This embodiment shows an example in which the present invention is applied to a passive matrix type transmissive liquid crystal device acting as an electrooptical device. The liquid crystal device of this embodiment is provided with a color filter substrate of the present invention and has a feature in the structure of color filters. Note that, in this embodiment, description is given of the case, for example, in which the color filter substrate is disposed on an observer side.

Figure 2:
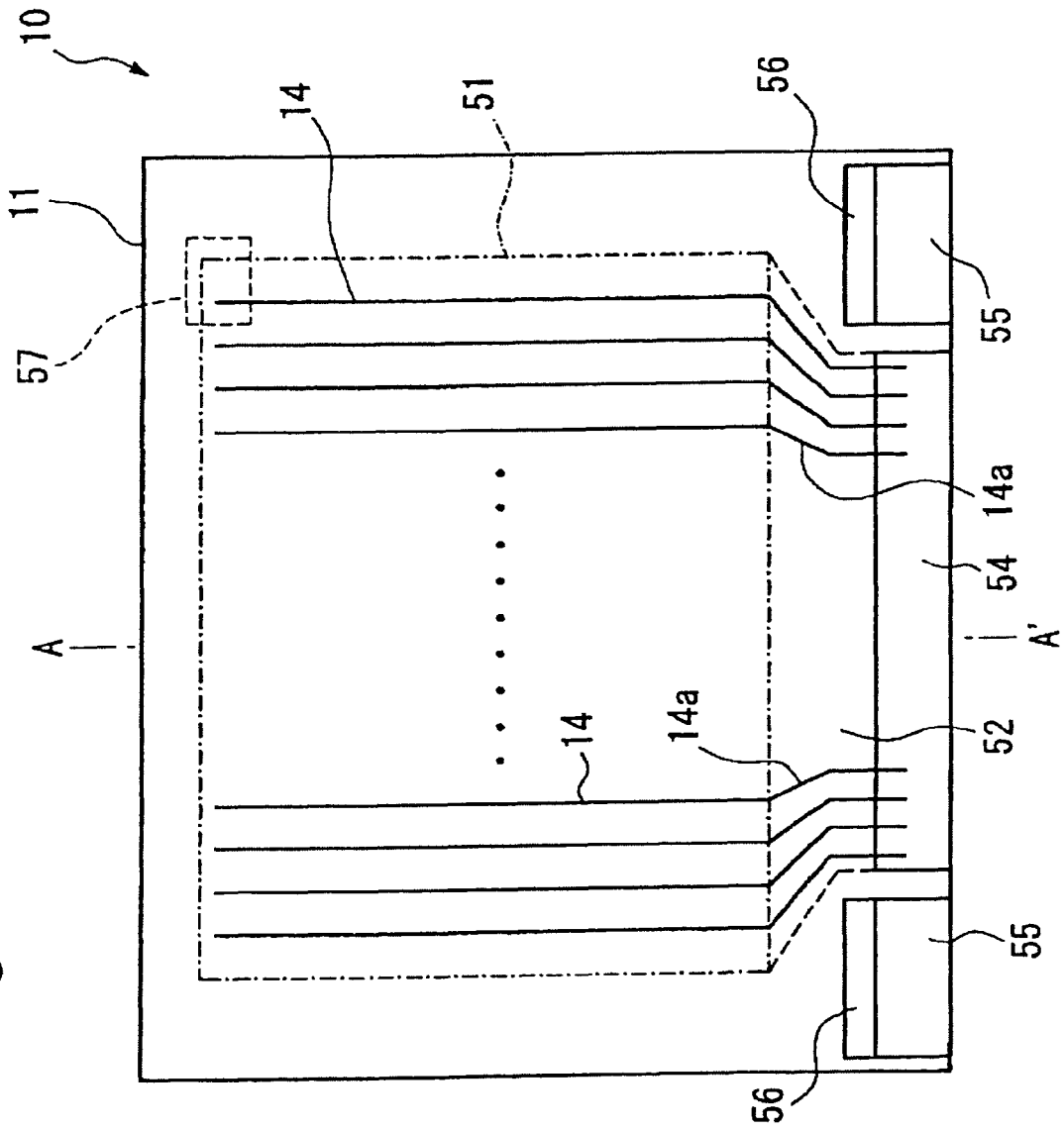
FIG. 2 is a plan view of a color filter substrate constituting the transmissive liquid crystal device of the first embodiment according to the present invention when it is viewed from a liquid crystal layer side.
Figure 3:
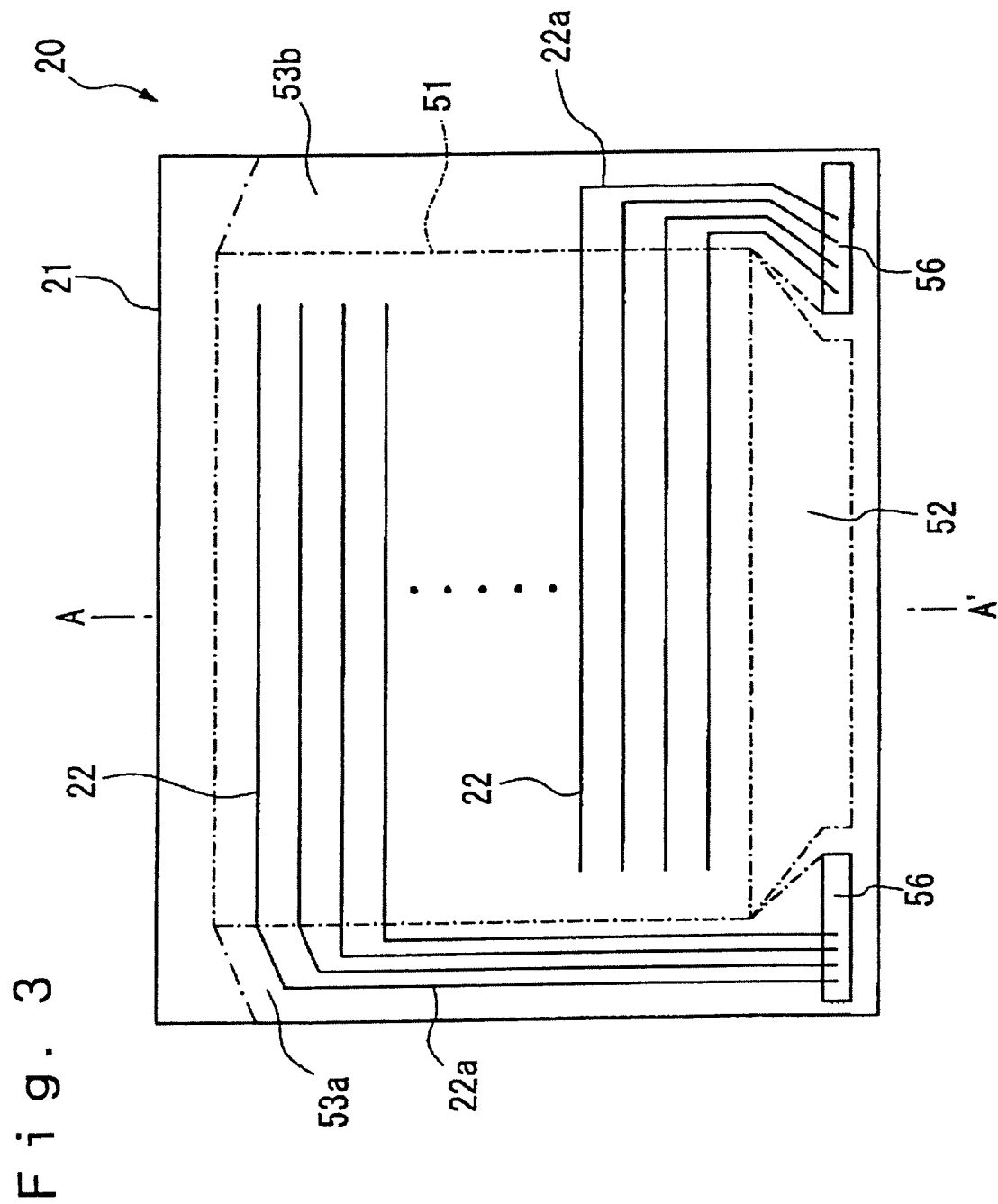
FIG. 3 is a plan view of the confronting substrate constituting the transmissive liquid crystal device of the first embodiment according to the present invention when it is viewed from the liquid crystal layer side.
Figure 4:
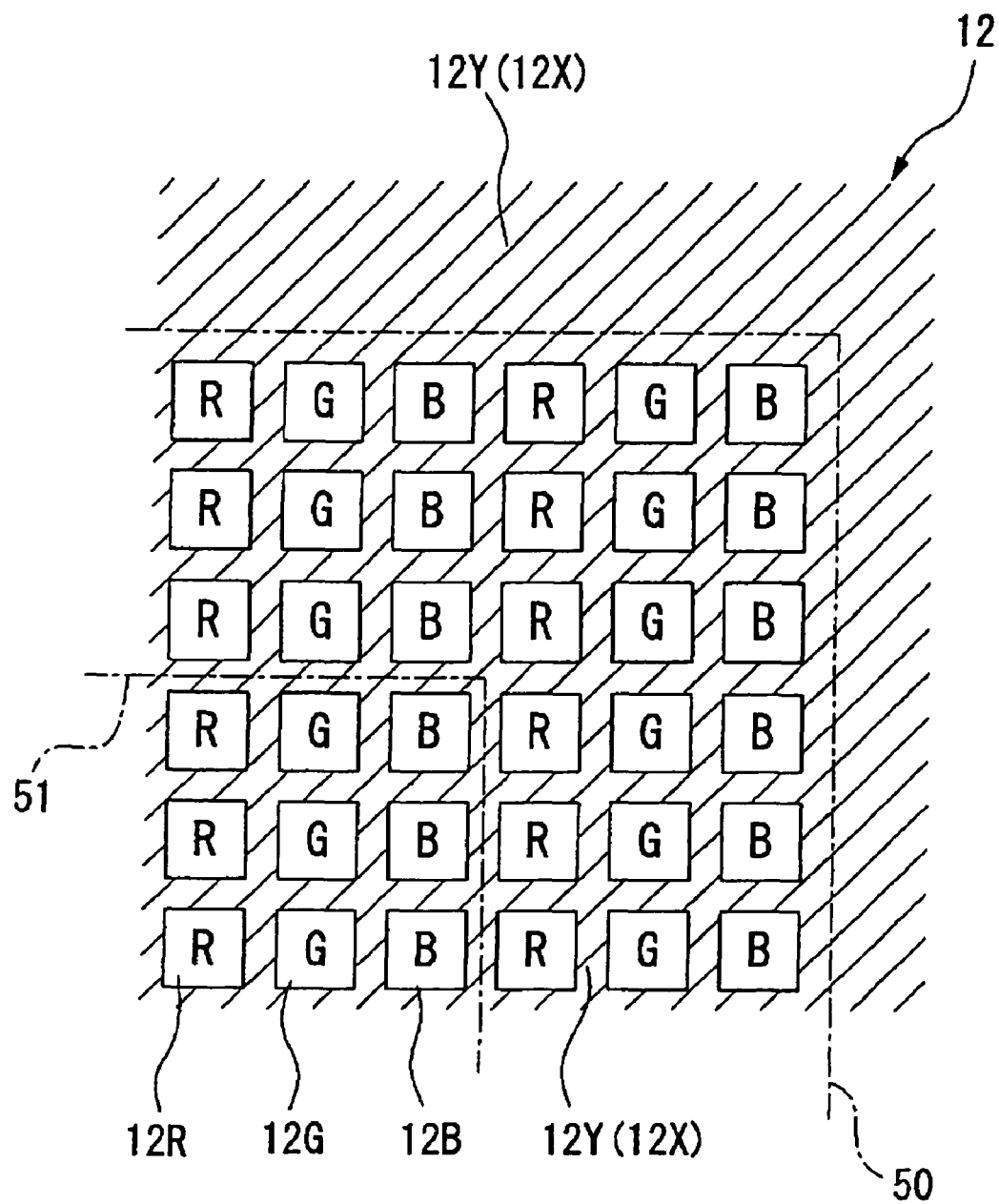
FIG. 4 is a partial plan view of color filters included in the transmissive liquid crystal device of the first embodiment according to the present invention when they are viewed from the liquid crystal layer side.
Figure 5:
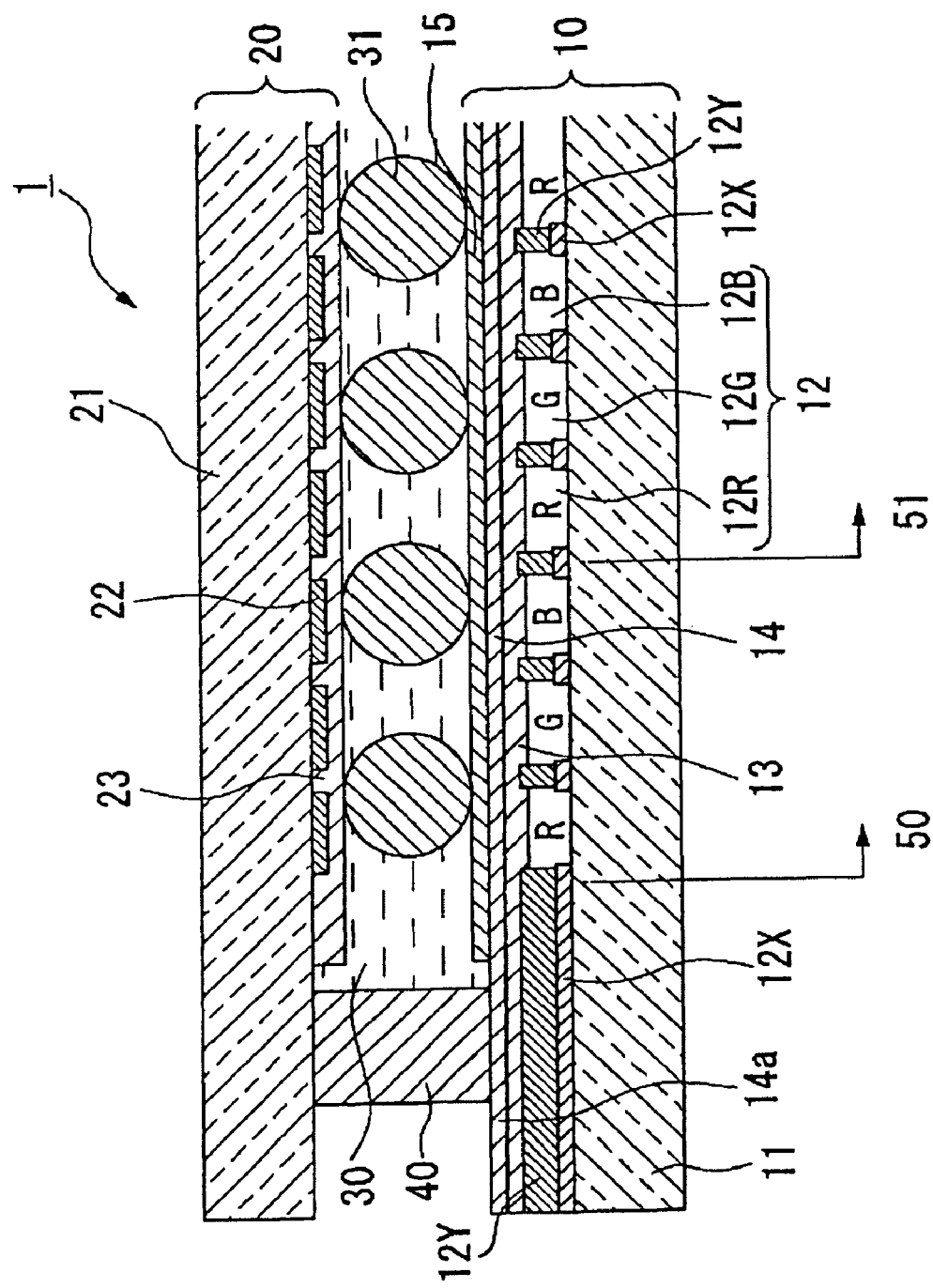
FIG. 5 is a partial plan view showing a structure of the transmissive liquid crystal device of the first embodiment according to the present invention.

A structure of the liquid crystal device of this embodiment will be described below based on FIGS. 1-5. FIG. 1 is a plan view of the exemplary liquid crystal device of the embodiment when it is viewed from the side of a confronting substrate which will be described later. FIG. 2 is a plan view of the color filter substrate constituting the liquid crystal device of the embodiment when it is viewed from a liquid crystal layer side. FIG. 3 is a plan view of the confronting substrate constituting the liquid crystal device of the embodiment when it is viewed from the liquid crystal layer side. FIG. 4 is a partial plan view of color filters included in the liquid crystal device of the embodiment when they are viewed from the liquid crystal layer side and is a view showing the region of a color filter denoted by reference numeral 57 in FIG. 2 in enlargement. FIG. 5 is a sectional view showing the structure of the liquid crystal device of the embodiment and is a fragmentary sectional view of the liquid crystal device of the embodiment when it is taken along the line A-A' shown in FIGS. 2 and 3.

As shown in FIG. 1, in the exemplary liquid crystal device 1 of the embodiment, a color filter substrate 10 and a confronting substrate 20 acting as a pair of substrates are bonded to each other at a predetermined interval through a seal member 40, and a liquid crystal layer 30 is enclosed inside the seal member 40. In the liquid crystal device 1, a display region 51 is located inside the inner end surface of the seal member 40, and the outside of the display region 51 is arranged as a non-display region.

The seal member 40 is annularly formed between the peripheral edges of the color filter substrate 10 and the confronting substrate 20, and a liquid crystal injecting hole 41 is formed through a portion of the seal member 40 so that a liquid crystal is injected therethrough. The liquid crystal injecting hole 41 is sealed with a seal material 42 after the liquid crystal is injected between the color filter substrate 10 and the confronting substrate 20 (into a liquid cell) therefrom.

Further, a backlight (light illumination means, not shown) is disposed to the confronting substrate 20 on the side not facing the color filter substrate 10, and polarizers (not shown) for permitting only specific polarized light to pass therethrough are attached to the color filter substrate 10 and the confronting substrate 20 on their sides not facing the liquid crystal layer 30, respectively. Then, the light outgoing from the backlight sequentially passes through the polarizers on the confronting substrate 20, the confronting substrate 20, the liquid crystal layer 30, the color filter substrate 10, and the polarizers on the color filter substrate 10 and enters observer's eyes.

Further, the lower end of the color filter substrate 10 shown in the figure is located outside the confronting substrate 20, and an externally connecting terminal section (not shown), which is described later, is disposed to the portion of the color filter substrate 10 located outside the confronting substrate 20.

Next, the internal structure of the liquid crystal device 1 of the embodiment will be described in detail. As shown in FIG. 5, the color filter substrate 10 is schematically arranged by sequentially laminating color filters 12 each composed of colored portions 12R, 12G, and 12B in a predetermined pattern, an overcoat layer 13 for protecting the color filters 12 as well as for flattening the surface of a substrate main body 11 on which the color filters 12 are formed, transparent electrodes 14 for applying a voltage to the liquid crystal layer 30, and an orientation film 15 for regulating the orientation of the liquid crystal molecules in the liquid crystal layer 30 on the surface of the substrate main body 11 on the liquid crystal layer 30 side thereof. Further, in the color filter substrate 10, a light shielding layer 12X and a resin member 12Y (bank) are formed at least between the adjacent colored portions 12R-12B.

In contrast, the confronting substrate 20 is schematically arranged by sequentially laminating transparent electrodes 22 for applying a voltage to the liquid crystal layer 30 and an orientation film 23 for regulating the orientation of the liquid crystal molecules in the liquid crystal layer 30 on the surface of a substrate main body 21 on the liquid crystal layer 30 side thereof.

Here, the substrate main bodies 11 and 21 are composed of a light-transmissive substrate, such as a glass and a transparent resin, the overcoat layer 13 is composed of an organic film, and the like, and the transparent electrodes 14 and 22 are composed of a transparent conductive material such as an indium tin oxide, respectively. Further, the orientation films 15 and 23 are composed of a polyimide film, and the like the surface of which has been subjected to rubbing. Further, a multiplicity of spherical spacers 31 composed of silicon dioxide, a resin, and the like are interposed between the color filter substrate 10 and the confronting substrate 20 (in the liquid crystal layer 30) to provide a uniform cell gap.

Next, the plain structure of the transparent electrodes 14 and 22 and the structures of the lead wirings, and the like connected to the transparent electrodes 14 and 22 will be described based on FIGS. 2 and 3. Note that, in FIGS. 2 and 3, the seal member 40 is omitted although it is formed at the peripheral edges of the color filter substrate 10 and the confronting substrate 20 outside the display region 51.

As shown in FIGS. 2 and 3, the plurality of transparent electrodes 14 and 22 are disposed on the color filter substrate 10 and the confronting substrate 20 in a stripe shape, and the respective transparent electrodes 14 and the respective transparent electrodes 22 extend in directions where they intersect with each other. The embodiment will be described as to a case in which the transparent electrodes 14 extend in a vertical direction on the figure and the transparent electrodes 22 extend in a lateral direction thereon.

Lead wirings 14a and 22a are connected to one ends of the transparent electrodes 14 and 22 formed in the display region 51. These lead wirings 14a and 22a are disposed outside the display region 51 (that is, in a non-display region) on the surfaces of the color filter substrate 10 and the confronting substrate 20.

As shown in FIG. 2, on the color filter substrate 10, the lead wirings 14a are connected to the lower ends of the transparent electrodes 14 in the figure and disposed in the lower region of the display region 51 in the figure. Hereinafter, the region in which the lead wirings 14a are disposed is referred to as a lead wiring region (lead wiring forming region) 52. In contrast, as shown in FIG. 3, on the confronting substrate 20, the lead wirings 22a are connected to the left ends or the right ends of the transparent electrodes 22 on the figure and disposed in the two regions, that is, in the right and left regions of the display region 51 on the figure. Hereinafter, the regions in which the lead wirings 22a are disposed are referred to as lead wiring regions 53a and 53b.

While the transparent electrodes 14 and 22 are connected to the externally connecting terminal section through the respective lead wirings 14a and 22a, the externally connecting terminal section is disposed only on the color filter substrate 10 in the embodiment as described above. Specifically, as shown in FIG. 2, an externally connecting terminal section 54 for the lower electrodes (14) is disposed at the center of an end of the color filter substrate 10, and externally connecting terminal sections 55 for the upper electrodes (21) are disposed on both the sides thereof. The upper electrode externally connecting terminal sections 55 are disposed separately at the two positions in correspondence to the lead wiring regions 53a and 53b.

The lead wirings 14a are electrically connected to the lower electrode externally connecting terminal section 54, and the transparent electrodes 14 are electrically connected to the externally connecting terminal section 54 through the lead wirings 14a. In contrast, the lead wirings 22a are connected to vertically conducting sections 56 formed by enclosing conductive particles in a part of the seal member 40. The vertically conducting sections 56 are disposed at two positions in correspondence to the lead wiring regions 53a and 53b, and the respective vertically conducting sections 56 are electrically connected to the upper electrode externally connecting terminal section 55 disposed to the color filter substrate 10. Accordingly, the transparent electrodes 22 are electrically connected to the externally connecting terminal section 55 through the lead wirings 22a and the vertically conducting sections 56.

Then, the transparent electrodes 14 and 22 are driven by directly mounting driving ICs (integrated circuits), which supplies signals to the transparent electrodes 14 and 22, on the externally connecting terminal section 54 and 55 or by electrically connecting a flexible printed circuit, on which the driving ICs for supplying signals to the transparent electrodes 14 and 22 are mounted, to the externally connecting terminal section 54 and 55.

It should be noted that the wiring structure of the lead wirings 14a and 22a and the connecting structure of the lead wirings 14a and 22a to the externally connecting terminal section 54 and 55 are not limited to the illustrated ones and may be appropriately designed. Further, while the embodiment is described as to a so-called vertically conducting type in which the externally connecting terminal sections are disposed only to one of the substrates, it should be understood that it is also possible to provide the externally connecting terminal sections with the respective substrates and to electrically connecting the transparent electrodes formed on each substrate to the same substrate through lead wirings.

Next, the structures of the color filters 12, the light shielding layer 12X, and the resin member 12Y included in the liquid crystal device 1 of the embodiment will be described in detail.

As described above, the respective transparent electrodes 14 on the color filter substrate 10 and the respective transparent electrodes 22 on the confronting substrate 20 extend in the directions that intersect each other. Then, in the liquid crystal device 1 of the embodiment, the regions, where the respective transparent electrodes 14 intersect the respective transparent electrodes 22, form respective pixels, and each of the color filters 12 has red (R), green (G), and blue (B) colored portions 12R, 12G, and 12B formed thereto in a predetermined pattern, corresponding to each pixel.

While the color filters 12 (colored portions 12R, 12G, and 12B) are formed in the display region 51 which is located at least inside the inner end surface of the seal member 40, there are a case in which they are formed only in the display region 51 and a case in which they are additionally formed outside the display region 51 by several pixels. In this embodiment, the case in which the color filters 12 are additionally formed outside the display region 51, as shown in FIG. 5, will be described. Further, hereinafter, the region where color filters 12 (colored portions 12R, 12G, and 12B) are formed will be referred to as a color filter forming region 50.

It should be noted that, while the width of the colored portions 12R to 12B is shown in enlargement in the figure, actually, the width of them is very minute and set to about 0.15 to 0.3 mm, whereas the interval between the inner end surface of the seal member 40 and the display region 51 or the color filter forming region 50 is set to about 0.2 to 3 mm which is larger than the width of the colored portions 12R to 12B. Accordingly, the color filter forming region 50 is also located inside the inner end surface of the seal member 40 similarly to the display region 51.

Further, in the color filter substrate 10, the light shielding layer (black matrix) 12X is formed between the adjacent pixels (the adjacent colored portions 12R-12B) in the color filter forming region 50. Further, in the embodiment, the colored portions 12R-12B are formed using the inkjet method, and, in the color filter forming region 50, the resin member 12Y is formed on the light shielding layer 12X to partition the pixels, in which the respective colored portions 12R-12B are formed, when the colored portions 12R-12B are formed.

It should be noted that the height of the resin member 12Y is about 1-3 μm, while the light shielding layer 12X has a film thickness of about 0.1-1.5 μm. Thus, the total height of the light shielding layer 12X and the resin member 12Y is about 1.1-4.5 μm, which may not be negligible with respect to the cell gap (several microns—10 μm).

Further, in forming the colored portions 12R-12B by an inkjet method, colored inks of red, green, and blue are ejected from inkjet nozzles. However, the viscosity of the inks must be set to a low level to permit ink droplets to be continuously ejected from the inkjet nozzles without clogging the nozzles with the ink droplets. Therefore, a predetermined amount of a solvent must be blended with the inks to be used to reduce the viscosity thereof. As a result, even if the inks are ejected into the respective pixels surrounded by the resin member 12Y, such that the height of them is higher than the highest portion of the resin member 12Y, the volume of the inks is reduced in the process for drying the ejected inks and removing the solvent, thereby the height of the thus formed colored portions 12R-12B is lower than the total height of the film thickness of the light shielding layer 12X and the height of the resin member 12Y by about 0.1-4 μm.

Accordingly, in the color filter forming region 50, the maximum height of the layer, in which the color filters 12, the light shielding layer 12X and the resin member 12Y are formed, corresponds to the height of between the adjacent colored portions 12R-12B, that is, to the height of the portion where the light shielding layer 12X overlaps the resin member 12Y.

Here, the constituting materials of the respective elements constituting the color filters 12 will the briefly described. As described above, the colored portions 12R, 12G, and 12B are formed using the colored inks of red, green, and blue, respectively. In contrast, the light shielding layer 12X is composed of a light shielding material (material having a low light transmitting property) such as a black resin containing black particles, for example, carbon particles, and the like, a metal such as chrome, and the like, a metal compound, and so on. Further, the resin member 12Y is composed of a resin, and the like having no conductivity. Note that when the resin member 12Y are composed of the light shielding material such as the black resin, and the like, the light shielding layer 12X can be omitted.

Next, the region where the color filters 12, the light shielding layer 12X and the resin member 12Y are formed will be described. As described above, the color filters 12 (colored portions 12R-12B) are formed inside the inner end surface of the seal member 40, in the color filter forming region 50 including the display region 51. In contrast, as shown in FIG. 5, the light shielding layer 12X and the resin member 12Y are formed on the approximately entire surface of the color filter non-forming region (the region outside of the color filter forming region 50), as well as between the adjacent pixels (between the adjacent colored portions 12R-12B).

That is, the plain structure of the color filters 12, the light shielding layer 12X, and the resin member 12Y provided with this embodiment is as shown in FIG. 4. In the color filter forming region 50 including the display region 51, the colored portions 12R-12B constituting the color filters 12 are disposed in a matrix shape in correspondence to the respective pixels disposed in a matrix shape, and the light shielding layer 12X and the resin member 12Y are formed between the adjacent pixels (between the adjacent colored portions 12R-12B). Accordingly, in the color filter forming region 50 including the display region 51, the light shielding layer 12X and the resin member 12Y are formed in a lattice shape in a horizontal plane. Further, the light shielding layer 12X and the resin member 12Y are formed on the approximately entire surface of the color filter non-forming region located outside the color filter forming region 50. Note that the pattern of the colored portions 12R-12B shown in FIG. 4 is only an example and the present invention is by no means limited to the pattern.

Here, the approximately entire surface of the color filter non-forming region can mean the region including the seal member 40 forming region and the lead wiring regions 52, 53a, 53b, and the like described above and excluding the region which requires a light transmitting property.

Further, a region where a light transmitting property is required can mean, for example, portions where optically recognizable alignment marks are formed or the vicinity thereof. The alignment marks are disposed outside the seal member 40 forming portion as marks used when the color filter substrate 10 is bonded to the confronting substrate 20 in the manufacture of the liquid crystal device 1. Then, in the embodiment, an effect of simultaneously forming the light shielding layer 12X and the alignment marks can be also obtained by partly leaving the portions outside the seal member 40 forming region, where the light shielding layer 12X is not formed, when the light shielding layer 12X is patterned.

For example, as shown in the corner portion of the color filter substrate 10 illustrated in FIG. 7(a) in enlargement, when the light shielding layer 12X is patterned such that a cross-shaped portion 62 where the light shielding layer 12X is not formed remains at the corner, the cross-shaped portion 62 can be optically read, thereby serving as an alignment mark.

Further, as shown in FIG. 7(b), when the light shielding layer 12X is patterned such that a rectangular portion 63 in which the light shielding layer 12X is not formed is formed in the corner portion of the color filter substrate 10 and a cross-shaped portion 64 in which the light shielding layer 12X is formed is disposed inside the rectangular portion 63, the cross-shaped portion 64 can be optically read, thereby serving as an alignment mark.

As described above, according to this embodiment, the resin member 12Y is formed also in the seal member 40 forming region, and in manufacturing the liquid crystal device 1, the color filter substrate 10 on which necessary elements such as the color filters 12 and the transparent electrodes 14 are formed is bonded to the confronting substrate 20 on which necessary elements such as the transparent electrodes 22 are formed, through an unhardened seal member, and then the unhardened seal member is hardened while pressure is applied from the outside of the color filter substrate 10 and the confronting substrate 20, to form the liquid cell. Thus it should be noted that the resin member 12Y which is located just under the seal member 40, must be composed of a material having such a degree of pressure resistance as not to be deformed when the pressure is applied from the outside of the color filter substrate 10 and the confronting substrate 20.

Figure 6:
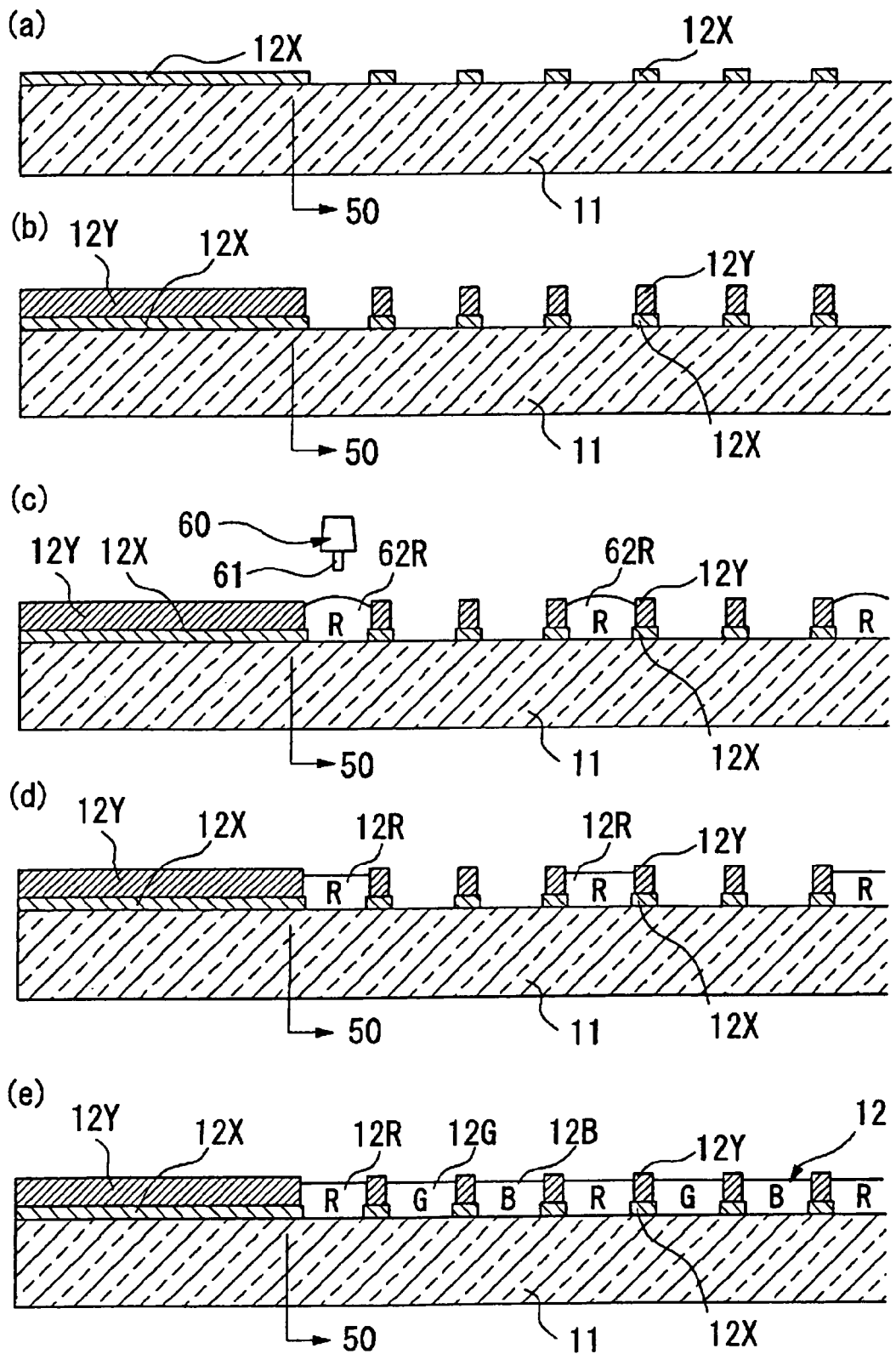
FIGS. 6(a) to (e) are process views showing a method of forming the color filters, light shielding layers, and resin members included in the transmissive liquid crystal device of the first embodiment according to the present invention.

Next, an example of a method of forming the color filters 12, the light shielding layer 12X, and the resin member 12Y included in the liquid crystal device 1 of the present embodiment will be described based on FIG. 6. Note that FIGS. 6(a)-(e) are fragmentary sectional views showing respective forming processes.

First, the substrate main body 11 is prepared, and the light shielding layer 12X having the pattern, as shown in FIGS. 4 and 5, is formed on the entire surface of the substrate main body 11.

The light shielding layer 12X, can be composed of a black resin and has the predetermined pattern, is formed, for example, as described below. A negative resist mainly including a black pigment containing carbon particles, and the like, the monomer of an acrylic resin, and the like, and a polymerization initiator is coated on the entire surface of the substrate main body 11 by a spin coating method, and tentatively baked. Next, the resist is exposed at predetermined positions using a photo mask on which the pattern of the light shielding layer 12X has been formed. The resist having been exposed is made to a resin insoluble in a solvent by the photo-polymerizing reaction of the monomer. Finally, when the resist is developed, only the portions, which have been exposed and made insoluble in a solvent, remain, thereby forming the light shielding layer 12X having the predetermined pattern as shown in FIGS. 4 and 5.

It should be noted that the light shielding layer 12X having the predetermined pattern is formed likewise even if a positive resist, which is made soluble in a solvent by being exposed, is used in place of the negative resist, which is made insoluble in a solvent by being exposed, and the portions, where the light shielding layer 12X are not formed, are exposed.

Further, the light shielding layer 12X, which is composed of a metal such as chrome or a metal compound and has the predetermined pattern, may be formed, for example, as described below. The light shielding layer 12X having the predetermined pattern shown in FIGS. 4 and 5 is formed by forming a film of a metal such as chrome or a metal compound on the entire surface of the substrate main body 11 by sputtering, and the like, and then by forming the predetermined pattern by photolithography.

After the light shielding layer 12X having the predetermined pattern has been formed as described above, a light sensitive resist for the resin member 12Y is coated on the entire surface of the substrate main body 11, on which light shielding layer 12X has been formed, by a spin coating method and the like, and exposed and developed as shown in FIG. 6(b) similarly to the case in which the light shielding layer 12X composed of the black resin, and the like is formed, thereby forming the resin member 12Y having the pattern as shown in FIGS. 4 and 5.

Next, the color filters 12 (colored portions 12R-12B) are formed using an inkjet method. That is, as shown in FIG. 6(c), an inkjet nozzle 60 is filled with a red ink 62R prepared by solving a red pigment, an acrylic resin, and the like in a solvent, and the red ink 62R is ejected from the ejection nozzles 61 of the inkjet nozzle 60 only to the pixels which form the coloring portion 12R by moving the inkjet 60 relatively to the substrate main body 11 with the ejection nozzles 61 confronting the substrate main body 11. At this time, as shown in the figure, while the resin member 12Y acting as partitions is formed around the peripheries of the pixels forming the respective colored portions 12R-12B, the red ink 62R is ejected so that the central portion thereof is higher than the highest portion of the resin member 12Y as well as no ink leaks to the adjacent pixels.

Next, as shown in FIG. 6(d) the red coloring portion 12R is formed, for example, by tentatively baking the red ink 62R and removing the solvent by heating the entire substrate main body 11, onto which the red ink 62R has been ejected, to approximately 40-180° C. In this process, the height of the thus formed coloring portion becomes lower than the highest portion of the resin member 12Y because the volume of the coloring portion is reduced by the removal of the solvent from the red ink 62R.

The colored portions 12R-12B having the predetermined pattern are formed by repeating the processes shown in FIGS. 6(c) and (d) as to the green colored portions 12G and the blue colored portions 12G. The color filters 12 composed of the colored portions 12R-12B having the predetermined pattern, the light shielding layer 12X having the predetermined pattern, and the resin member 12Y are formed by finally baking (finally hardening) the colored portions 12R-12B by heating the entire substrate main body 11, on which colored portions 12R-12B have been formed, to about 150-270° C.

Note that the intimate contact property of the colored portions 12R-12B to the substrate main body 11 is increased by finally baking the colored portions 12R-12B, so that the exfoliation of the colored portions 12R-12B from the substrate main body 11 is prevented in a subsequent process for forming the overcoat layer 13. Further, while only the case, in which the color filters 12 are formed in the sequence of the colored portions 12R, 12G, and 12B, has been described in this embodiment, they may be formed in any sequence.

The color filter substrate 10 included in the liquid crystal device 1 of the embodiment employs such the arrangement that the light shielding layer 12X is formed on the approximately entire surface of the color filter non-forming region, in addition to the color filter forming region 50 including the display region 51. Since the area in which the colored portions 12R-12B are formed outside the display region 51 is very small and corresponds only to several pixels, it becomes possible to shield the approximately entire surface of the non-display region from light with the light shielding layer 12X by forming it on the approximately entire surface of the color filter non-forming region.

Accordingly, the light shielding layer 12X can serve as a parting member for shielding the non-display region of the liquid crystal device 1 of the embodiment from light.

Thus, according to the color filter substrate 10 included in the liquid crystal device 1 of the embodiment and the liquid crystal device 1 of the embodiment, the manufacturing process of electronic equipment can be simplified by mounting the liquid crystal device 1 of the embodiment thereon because the parting member and the light shielding layer 12X are formed in one process.

The manufacturing cost of electronic equipment is also reduced by mounting the liquid crystal device 1 of the embodiment thereon because a parting member need not be provided separately. Further, since the parting member need not be provided separately, and a margin which has been necessary due to the mounting accuracy of the parting member when it is mounted on the electronic equipment can be eliminated, an effect of increasing the area of the surface region of the electronic equipment is also obtained by mounting the liquid crystal device 1 of the embodiment.

Further, the color filter substrate 10 included in the liquid crystal device 1 of the embodiment further employs such the arrangement that the colored portions 12R-12B are formed by an inkjet method, and the resin member 12Y which is formed on the substrate main body 11 around the peripheries of the respective colored portions 12R-12B, when the colored portions 12R-12B are formed, in order to partition the respective pixels for forming the respective colored portions 12R-12B, are formed on the approximately entire surface of the color filter non-forming region, in addition to the color filter forming region 50 including the display region 51.

As described above, the highest place of the color filter forming region 50 in which the color filters 12, the light shielding layer 12X and the resin member 12Y are formed, is between the adjacent colored portions 12R-12B, that is, the height of the portion where the light shielding layer 12X overlaps the resin member 12Y. In the color filter substrate 10 included in the liquid crystal device 1 of the embodiment, however, since the light shielding layer 12X and the resin member 12Y are formed on the approximately entire surface of the color filter non-forming region, the maximum height of the color filter forming region 50 is made equal to the maximum height of the color filter non-forming region in the layer in which the color filters 12, the light shielding layer 12X, and the resin member 12Y are formed as shown in FIG. 5. As a result, any step between the color filter forming region 50 and the color filter non-forming region can be removed on the surfaces of the color filters 12, thereby the entire surfaces of the color filters 12 being approximately flattened.

Thus, according to the color filter substrate 10 included in the liquid crystal device 1 of the embodiment and according to the liquid crystal device 1 of the embodiment, the surface of the color filter substrate 10 is more flattened than that of a conventional color filter substrate, so that an effect of providing a liquid crystal device excellent in display quality can be also obtained because the cell gap is uniformly arranged.

Further, since the surface of the color filter substrate 10 is more flattened than that of the conventional color filter substrate, the transparent electrodes 14 (or the lead wirings 14a) formed on the color filters 12 are prevented from being broken, thereby realizing an effect of improving the yield rate of nondefective products.

Further, in the liquid crystal device 1 of the embodiment, both the light shielding layer 12X and the resin member 12Y are formed on the approximately entire surfaces of the color filter non-forming region. Thus, even if the seal member 40 is formed on the light shielding layer 12X and the resin member 12Y and the thicknesses of the light shielding layer 12X and resin member 12Y are changed without changing the thickness of the seal member 40, the cell gaps are not affected thereby at all. Thus, according to the embodiment, an effect of stabilizing the cell gaps is also obtained.

Note that while both the light shielding layer 12X and the resin member 12Y are formed on the approximately entire surface of the color filter non-forming region in the embodiment, it should be understood the present invention is not limited thereto and only the resin member 12Y may be formed on the approximately entire surface of the color filter non-forming region.

In the layer in which the color filters 12, the light shielding layer 12X and the resin member 12Y are formed, the highest portion of the color filter forming region 50 is between the adjacent colored portions 12R-12B, that is, the portion where the light shielding layer 12X overlaps the resin member 12Y. Thus, the difference between maximum height of the color filter forming region 50 and that of the color filter non-forming region may be reduced in the layer in which the color filters 12, the light shielding layer 12X, and the resin member 12Y are formed by forming the resin member 12Y on the approximately entire surface of the color filter non-forming region. As a result, there is obtained an effect of reducing the step between the color filter forming region 50 and the color filter non-forming region on the surface of the color filter substrate 10 and more flattening the surface of the color filter substrate 10 than that of the conventional color filter substrate, similarly to this embodiment.

In this arrangement, however, the light shielding layer 12X is not formed on the approximately entire surfaces of the color filter non-forming region. Thus, it is preferable to form the resin member 12Y of a light shielding material and to cause the resin member 12Y to act as a parting member.

Figure 8:
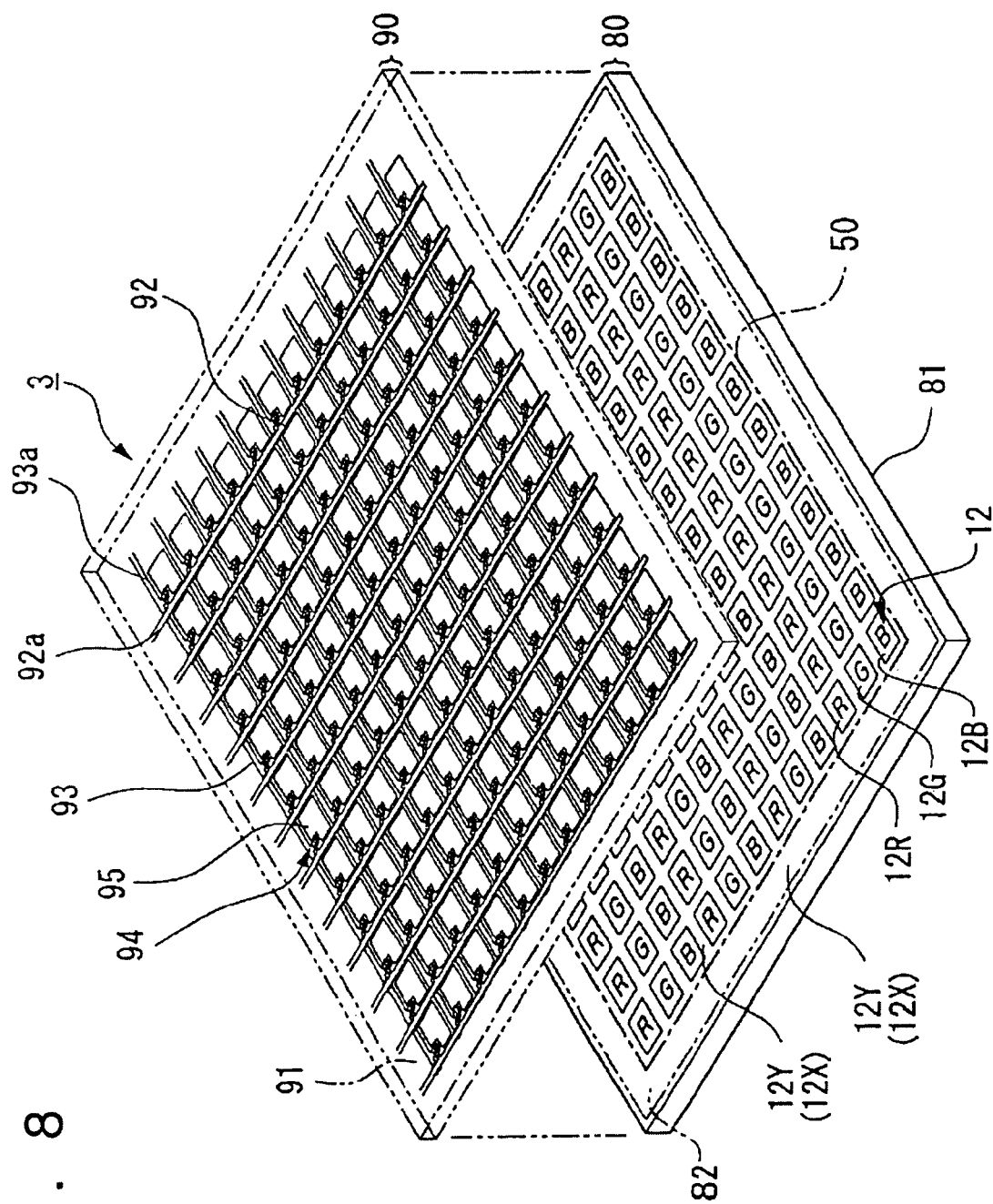
FIG. 8 is an exploded perspective view showing a structure of a transmissive liquid crystal device of a third embodiment according to the present invention.
Figure 9:
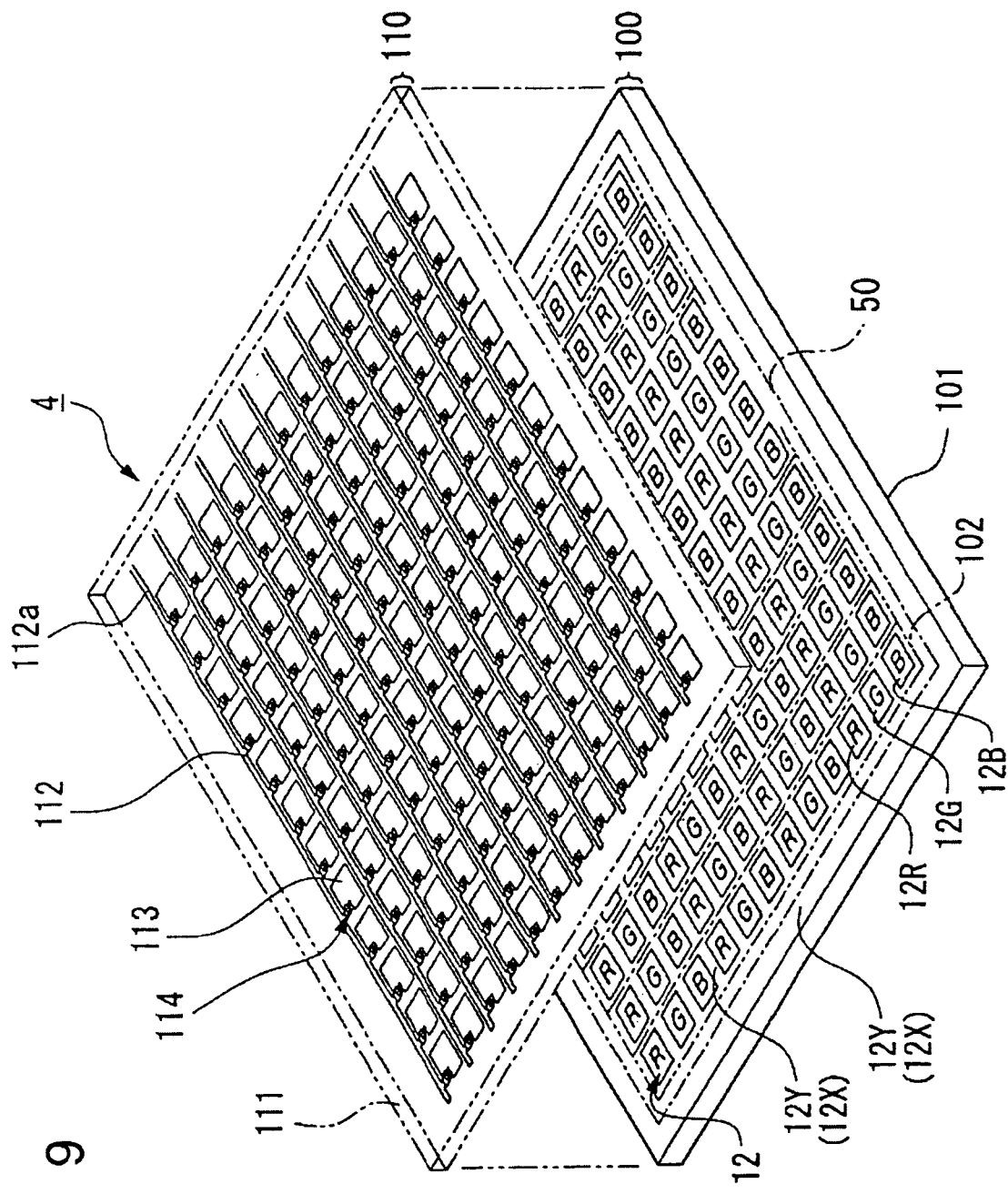
FIG. 9 is an exploded perspective view showing a structure of a transmissive liquid crystal device of a fourth embodiment according to the present invention.
Figure 10:
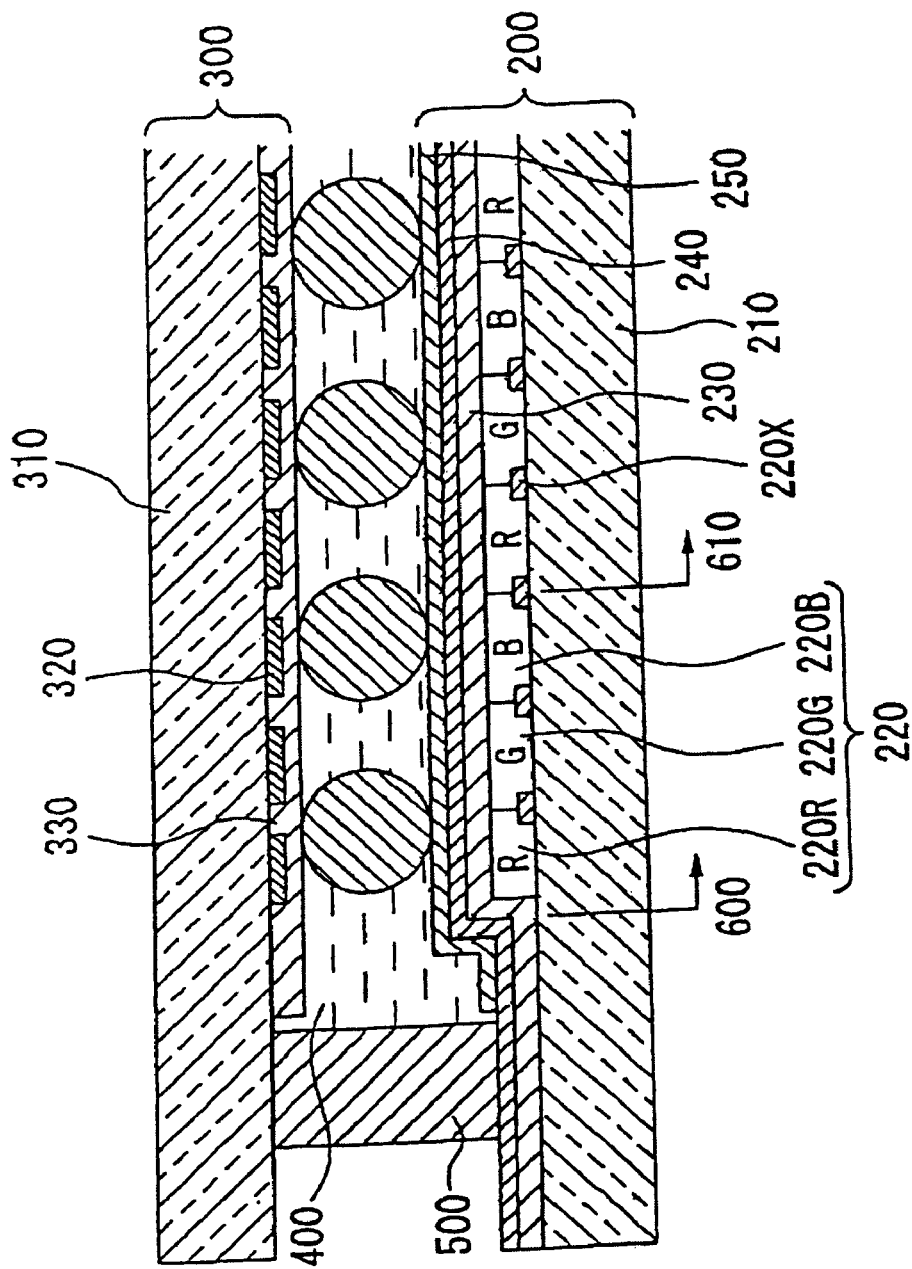
FIG. 10 is a sectional view showing a structure of a conventional transmissive liquid crystal device.

While the example in which the present invention is applied to the passive matrix type transmissive liquid crystal device has been described in the first embodiment, the present invention is by no means limited thereto. Now, a structure of an electrooptical device according to a second embodiment of the present invention will be described. This embodiment shows an example in which the present invention is applied to an active matrix type transmissive liquid crystal device using TFT (thin-film transistor) elements as switching elements (refer to FIG. 8). FIG. 8 is an exploded perspective view showing an entire structure of a liquid crystal device of this embodiment. The liquid crystal device of the embodiment can be provided with the color filters included in the liquid crystal device of the first embodiment. Thus, the same components as those in the first embodiment are denoted by the same reference numerals, and the description thereof is omitted. Note that similarly to the first embodiment, description will be given to an example in which the color filter substrate is disposed on an observer side in this embodiment.

The liquid crystal device 2 of this embodiment is approximately composed of a color filter substrate 80 and an element substrate 90 disposed in confrontation with each other with a liquid crystal layer (not shown) held therebetween.

The element substrate 90 is approximately arranged such that TFT elements 94, pixel electrodes 95, and the like are formed on the surface of a substrate main body 91 on the liquid crystal layer side thereof, and an orientation film (not shown) is formed on them on the liquid crystal layer side thereof. Further, the color filter substrate 80 is approximately arranged such that color filters 12, an overcoat layer (not shown), a common electrode 82, and an orientation film (not shown) are sequentially laminated on the surface of a substrate main body 81 on the liquid crystal layer side thereof.

In this embodiment, an end portion of the element substrate 90 is located outside the color filter substrate 80, and is provided with an externally connecting terminal section. In the figure, however, for the purpose of simplification, the externally connecting terminal section is omitted and the color filter substrate 80 and the element substrate 90 are shown to have an same area. Further, the color filter substrate 80 is bonded to the element substrate 90 at the respective peripheral edges thereof through a seal member (not shown).

In more detail, in the element substrate 90, a multiplicity of data lines 92 and a multiplicity of scan lines 93 are formed on the surface of the substrate main body 91 in a lattice shape so as to intersect with each other. The TFT elements 94 are formed in the vicinities of the intersections of the respective data lines 92 and the respective scan lines 93, and the pixel electrodes 95 are connected through the respective TFT elements 94. When the entire surface of the element substrate 90 is observed from its liquid crystal layer side, the multiplicity of pixel electrodes 95 are disposed in a matrix shape, and the regions, in which the respective pixel electrodes 95 are formed, are arranged as respective pixels in the liquid crystal device 2. Further, the respective data lines 92 and the respective scan lines 93 are electrically connected to the externally connecting terminal section (not shown) disposed to the element substrate 90 through lead wirings 92a and 93a connected to one ends thereof, respectively.

Further, the color filters 12 and the overcoat layer included in the color filter substrate 80 have the same structures as those of the color filters and the overcoat layer included in the liquid crystal device of the first embodiment. That is, each of the color filters 12 included in this embodiment is composed of red (R), green (G), and blue (B) colored portions 12R, 12G, and 12B formed in correspondence to each pixel in a color filter forming region 50 including a display region.

Further, on the surface of the color filter substrate 80, a light shielding layer 12X and a resin member 12Y are formed between the adjacent pixels (the adjacent colored portions 12R-12B) in the color filter forming region 50, and on the approximately entire surface of a color filter non-forming region including a seal member forming region and lead wire regions.

Further, the common electrode 82 is formed on the approximately entire surface of the color filter substrate 80 on the liquid crystal layer side of the color filters 12 and electrically connected to the externally connecting terminal section (not shown) disposed to the element substrate 90 through a vertically-conducting section (not shown) formed at a portion of a seal member.

As described above, the present invention can be also applied to an active matrix type liquid crystal device using TFT elements, and the color filter substrate 80 included in the liquid crystal device 2 of this embodiment has the color filters 12, the light shielding layer 12X, and the resin member 12Y included in the liquid crystal device of the first embodiment. As a result, the second embodiment can obtain the same effects as those of the first embodiment.

That is, according to the color filter substrate 80 included in the liquid crystal device 2 of this embodiment and according to the liquid crystal device 2 of the embodiment, a manufacturing process of electronic equipment can be simplified by mounting the liquid crystal device 2 of this embodiment thereon because a parting member and the light shielding layer 12X are formed in one process, so that the manufacturing cost of the electronic equipment can be reduced as well as the area of the display region of the electronic equipment can be increased.

Further, according to the color filter substrate 80 included in the liquid crystal device 2 of this embodiment and to the liquid crystal device 2 of the embodiment, the surface of the color filter substrate 80 is more flattened than that of a conventional color filter substrate and cell gaps are uniformly arranged, thereby an effect of providing a liquid crystal device excellent in display quality being also obtained. Further, since the surface of the color filter substrate 80 is more flattened than that of the conventional color filter substrate, the common electrode 82 (or the lead wirings connected to the common electrodes 82) formed on the color filters 12 can be prevented from being broken, thereby improving the yield rate of nondefective products.

Further, in the liquid crystal device 2 of the embodiment, both the light shielding layer 12X and the resin member 12Y are formed on the approximately entire surface of the color filter non-forming regions. Thus, even if the seal member is formed on the light shielding layer 12X and the resin member 12Y and the thicknesses of the light shielding layer 12X and the resin member 12Y are changed without changing the thickness of the seal member, the cell gaps are not affected thereby at all. Thus, according to this embodiment, an effect of stabilizing the cell gaps can be also obtained.

Next, a structure of an electrooptical device of a third embodiment of the present invention will be described. This embodiment shows an example in which the present invention is applied to an active matrix type transmissive liquid crystal device using TFD (thin-film diode) elements as switching elements. FIG. 8 is an exploded perspective view showing an entire structure of the liquid crystal device of the embodiment. The liquid crystal device of the embodiment is provided with the color filters included in the liquid crystal device of the first embodiment. Thus, the same components as those in the first embodiment are denoted by the same reference numerals, and the description thereof is omitted. Further, an example, in which a color filter substrate is disposed on an observer side similarly to the first embodiment, will be described also in this embodiment.

The liquid crystal device 3 of this embodiment is approximately composed of a color filter substrate 100 and an element substrate 110 disposed in confrontation with each other with a liquid crystal layer (not shown) held therebetween. The element substrate 110 is approximately arranged such that TFD elements 114, pixel electrodes 113, and the like are formed on the surface of a substrate main body 111 on the liquid crystal layer side thereof, and an orientation film (not shown) is formed on them on the liquid crystal layer side thereof. Further, the color filter substrate 100 is approximately arranged such that color filters 12, an overcoat layer (not shown), scan lines (confronting electrodes) 102, and an orientation film (not shown) are sequentially laminated on the surface of a substrate main body 101 on the liquid crystal layer side thereof.

It should be noted that an externally connecting terminal section is disposed to at least one of the color filter substrate 100 and the element substrate 110, and the portion where the externally connecting terminal section is disposed is located outside the confronting substrate, similarly to the first embodiment. However, in the figure, the color filter substrate 100 and the element substrate 110 are illustrated to have the same area as well as the illustration of the externally connecting terminal section is omitted for the purpose of simplification. Further, the color filter substrate 100 is bonded to the element substrate 110 at the respective peripheral edges thereof through a seal member (not shown).

In more detail, in the element substrate 110, a multiplicity of data lines 112 are disposed on the surface of a substrate main body 111 in a stripe shape, and a multiplicity of pixel electrodes 113 are connected to the respective data lines 112 through the TFD elements 114. When the entire surface of the element substrate 110 on the liquid crystal layer side thereof is observed, the multiplicity of pixel electrodes 113 are disposed in a matrix shape, and the regions, in which the respective pixel electrodes 113 are formed, are arranged as respective pixels in the liquid crystal device 3. Further, the respective data lines 112 are electrically connected to the externally connecting terminal section (not shown) disposed to at least one of the substrates through the lead wirings 112a connected to one ends of the data lines 112.

Further, the color filters 12 and the overcoat layer included in the color filter substrate 100 have the same structures as those of the color filters and the overcoat layer included in the liquid crystal device of the first embodiment, and each of the color filters 12 is composed of red (R), G (green), and B (blue) colored portions 12R-12B formed in correspondence to each pixel in a color filter forming region 50 including a display region.

Further, a light shielding layer 12X and a resin member 12Y are formed between the adjacent pixels (the adjacent colored portions 12R-12B) in the color filter forming region 50 and on the approximately entire surface of a color filter non-forming region including a seal member forming region and lead wire regions on the surface of the color filter substrate 80.

Further, in the color filter substrate 100, the strip-shaped scan lines (confronting electrodes) 102 are formed on the liquid crystal layer side of the color filters 12 in a direction intersecting the direction in which the data lines 112 of the element substrate 110 extend. The scan lines 102 are also electrically connected to the externally connecting terminal section (not shown) disposed to at least one of the substrates through the lead wirings (not shown) connected to one ends of the scan lines 102.

As described above, the present invention can be also applied to an active matrix type liquid crystal device using TFD elements, and the color filter substrate 100 included in the liquid crystal device 3 of this embodiment has the color filters 12, the light shielding layer 12X, and the resin member 12Y which are included in the liquid crystal device of the first embodiment. As a result, the third embodiment can obtain the same effects as those of the first embodiment.

That is, according to the color filter substrate 100 included in the liquid crystal device 3 of this embodiment and according to the liquid crystal device 3 of this embodiment, a manufacturing process of electronic equipment can be simplified by mounting the liquid crystal device 3 of the embodiment thereon because a parting member and the light shielding layer 12X are formed in one process, so that the manufacturing cost of the electronic equipment can be reduced as well as the area of the display region of the electronic equipment can be increased.

Further, according to the color filter substrate 100 included in the liquid crystal device 3 of this embodiment and according to the liquid crystal device 3 of this embodiment, the surface of the color filter substrate 100 can be more flattened than the surface of a conventional color filter substrate and cell gaps can be uniformly arranged, thereby realizing an effect of providing a liquid crystal device excellent in display quality. Further, since the surface of the color filter substrate 100 can be more flattened than the surface of the conventional color filter substrate, scan lines 102 (or the lead wirings connected to the scan lines 102) formed on the color filters are prevented from being broken, thereby realizing an effect of improving the yield rate of nondefective products.

Further, in the liquid crystal device 3 of this embodiment, both the light shielding layer 12X and the resin member 12Y are formed on the approximately entire surface of the color filter non-forming region. Thus, even if the seal member is formed on the light shielding layer 12X and the resin member 12Y and the thicknesses of the light shielding layer 12X and the resin member 12Y are changed without changing the thickness of the seal member, the cell gaps are not affected thereby at all. Thus, according to the embodiment, an effect of stabilizing the cell gaps is also obtained.

It should be noted that while only the case in which the color filter substrate side is located on the observer side has been described in the first to third embodiments, the present invention is by no means limited thereto, and the color filter substrate side may be located on a light incident side. Similar effects to those of the first to third embodiments can be also obtained in this case. Further, while only a transmissive liquid crystal device has been described in the first to third embodiments, the present invention is by no means limited thereto, and the present invention is also applicable to a reflective liquid crystal device and a reflective/semi-transmissive liquid crystal device, that is, it is applicable to a liquid crystal device of any structure.

Next, a structure of an electrooptical device of a fourth embodiment according to the present invention will be described.

This embodiment shows an example in which the present invention is applied to an active matrix type organic EL device (electrooptical device) using electroluminescence elements as pixels.

In manufacturing an organic EL device by an inkjet method, a first composition, which contains a positive hole injection layer forming material, or a second composition, which contains a light emitting layer forming material, is formed by an inkjet method. That is, the first composition containing the positive hole injection layer material dissolved or dispersed in a solvent or the second composition containing the light emitting material dissolved or dispersed in a solvent is ejected from an inkjet head and formed on electrodes composed of ITO (transparent electrodes). Note that partitions (hereinafter, referred to as banks) for partitioning pixel regions where the ITO is formed are provided so that the ejected ink droplets (liquid droplets) can accurately pattern-coat the predetermined pixel regions.

Figure 11:
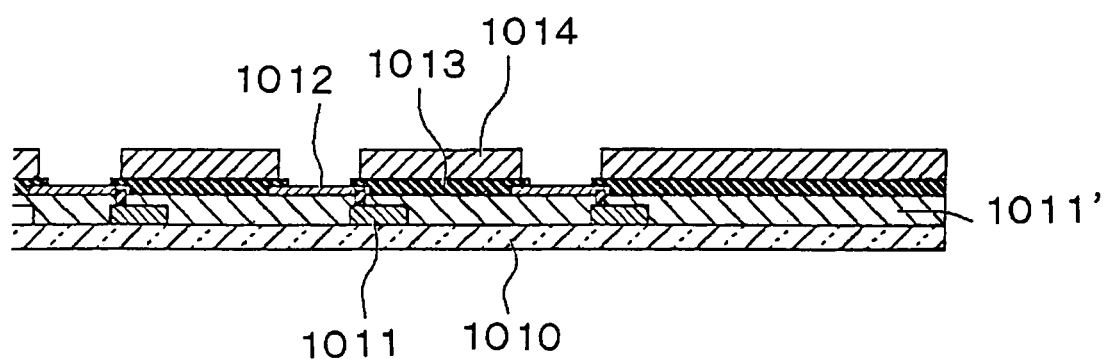
FIG. 11 is a sectional view showing an example of a method of manufacturing an organic EL device by an inkjet system.

FIG. 11 shows a sectional view of an example of a substrate structure of the organic EL device formed by an inkjet method. A circuit element portion 1011' having thin film transistors (TFTs) 1011 are formed on a glass substrate 1010, and transparent electrodes 1012 composed of an ITO are patterned on the circuit element portion 1011'. Further, a first bank 1013 composed of SiO2 and an organic material bank (second bank) 1014 composed of an organic material which is ink-repellent or arranged to have ink-repellency are laminated on each of the regions for partitioning the transparent electrodes 1012. While the opening of the banks (that is, the shape of each pixel region) may have any of a circular shape, an oval shape, and a square shape, the openings having the square shape are preferably rounded at the corners thereof because the ink composition has a surface tension. The material of the organic material bank 1014 is not particularly limited so long as it is excellent in heat resistance, liquid repellency, ink solvent resistance, and adhesion to a base substrate. The organic material bank 1014 need not be composed of a material having liquid-repellency by nature, for example, a fluorine resin and may be composed of an ordinarily employed organic resin, such as an acrylic resin, a polyimide resin, etc. which is patterned and whose surface may be made liquid-repellent by being subjected to CF4 plasma processing, and the like. The banks are not limited to the laminated inorganic and organic materials as described above. For example, when the organic material banks 1014 are composed of the ITO, it is preferable to provide SiO2 banks 1013 to improve the adhesion to the organic material banks 1014. The organic material banks 1014 preferably have a height of about 1-2 μm.

Figure 12:
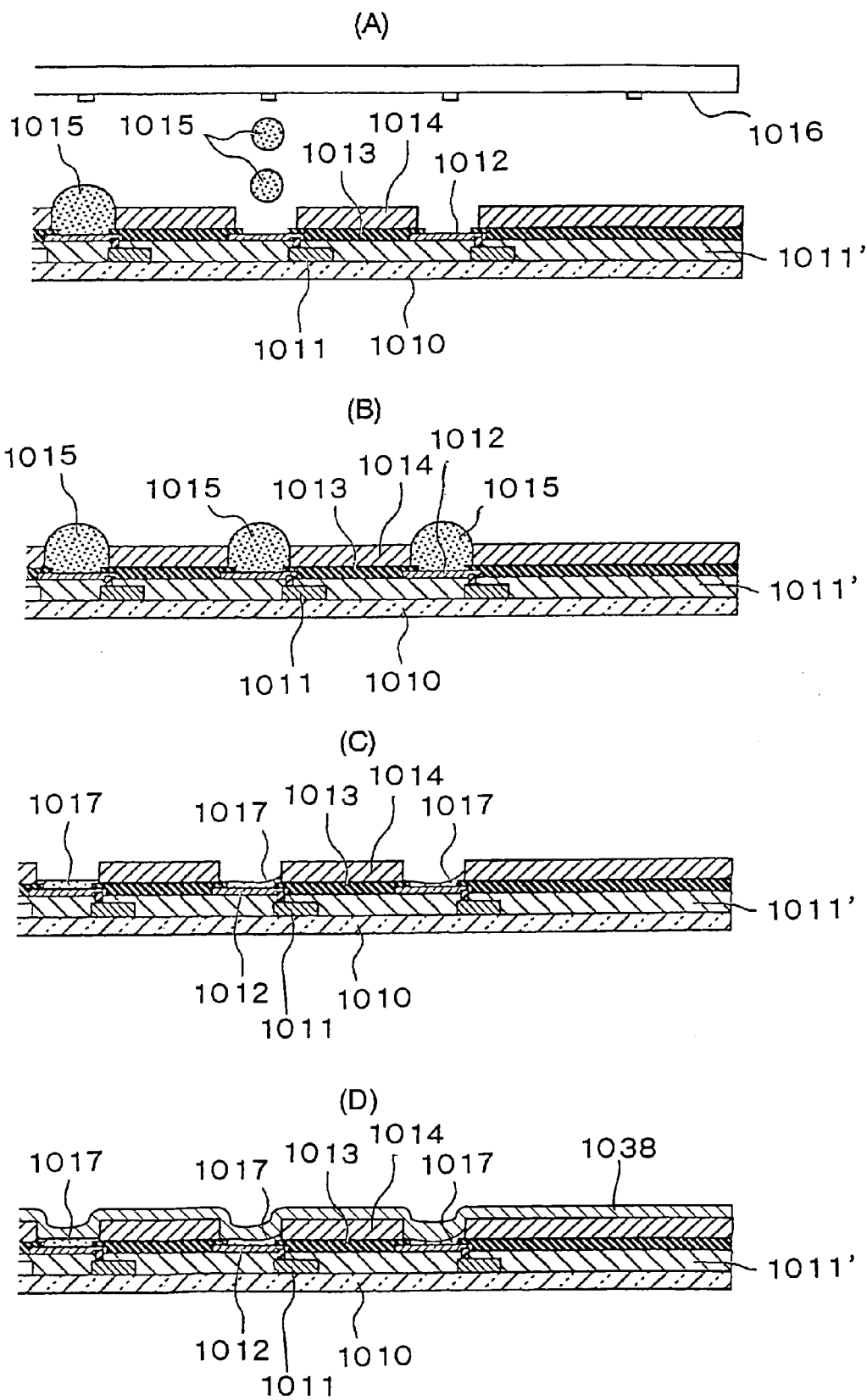
FIG. 12 is a sectional view showing an example of a method of manufacturing an organic EL device by an inkjet system according to the present invention.

Next, an example of a method of manufacturing the organic EL device (electrooptical device) by an inkjet method will be described according to the cross sectional structures thereof at respective processes with reference to FIG. 12.

In FIG. 12(A), a solution (a first composition) containing the positive hole injection layer forming material is coated on a substrate having a bank structure as liquid droplets by an inkjet method. Next, a solution (an ink composition) containing the organic EL element (light-emitting layer forming material) is coated as ink droplets. Then, an organic EL thin film is formed. The first composition containing the positive hole injection layer forming material and the second composition 1015 containing the organic EL material are ejected from an inkjet head 1016 and reached as shown in FIG. 12(B) so that they are pattern coated. After the completion of coating, the solvent is removed by vacuum and/or heat processing or by a flow of a nitrogen gas, and the like, thereby organic EL thin film layers 1017 are formed FIG. 12(C). Each of the organic EL thin film layers 1017 is a laminated film composed of, for example, a positive hole injection layer and a light-emitting layer. After the EL thin film layers 1017 are formed, a cathode 1038 is laminated, as shown in FIG. 12(D).

Figure 13:
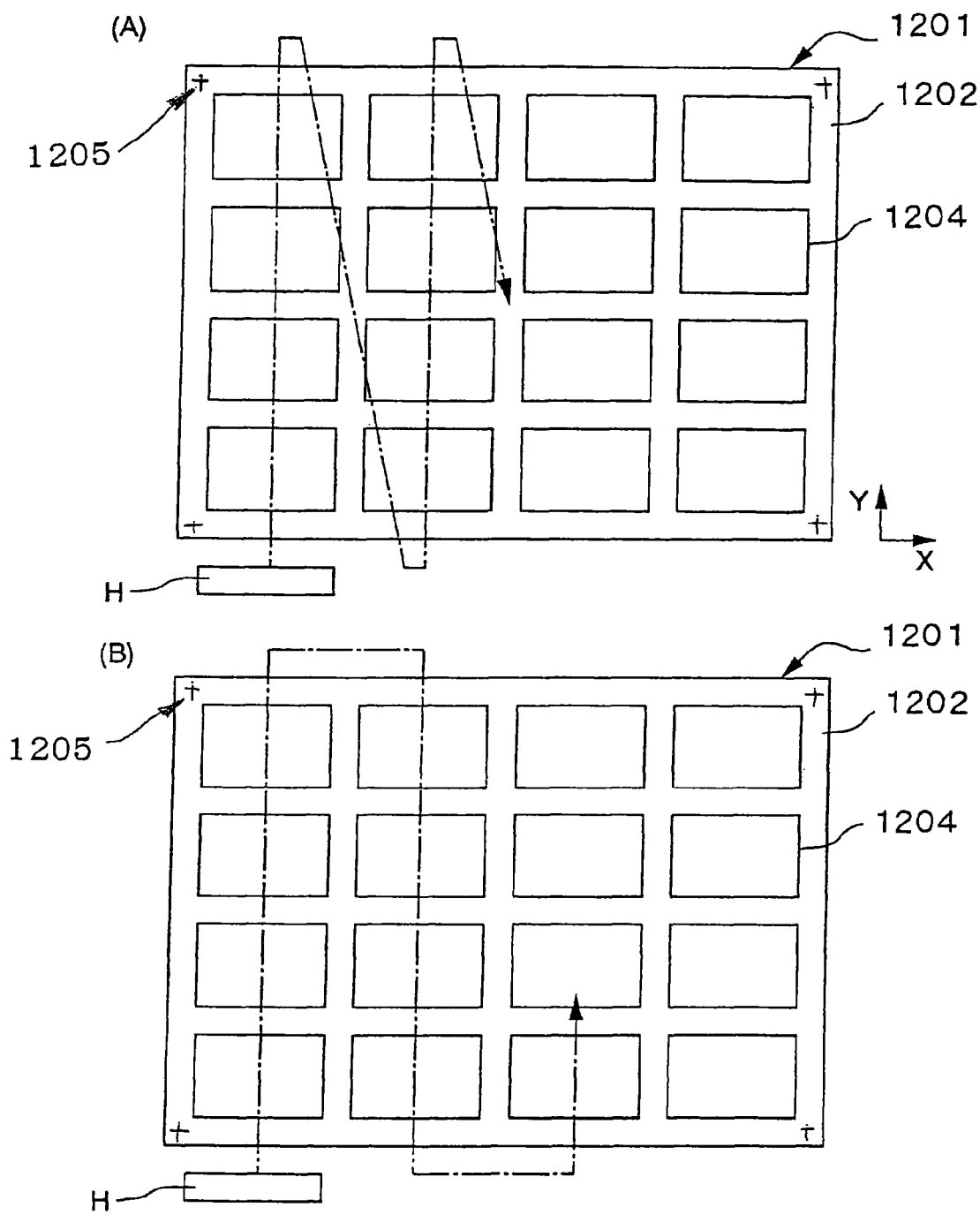
FIGS. 13(A) and (B) are schematic views explaining a method of manufacturing an organic EL device of an embodiment 4 and show the loci of an inkjet head, and alignment marks on the substrate.

FIG. 13 shows a plan view of a substrate employed in this embodiment. As shown in FIG. 13, the substrate 1201 is mainly composed of a not shown circuit element portion formed on a glass substrate 1202, a plurality of light-emitting elements 1204 formed on the circuit element portion, and alignment marks 1205. In the substrate 1201 of FIG. 13, 16 pieces of the light-emitting elements 1204 are disposed on a matrix of 4 columns by 4 rows. The organic material banks 1014 are formed between the respective light-emitting elements 1204 on the glass substrate 1202. Further, the alignment marks 1205 and the organic material banks 1014 can be simultaneously patterned. This makes the number of processes and the manufacturing cost reduced.

Further, the inkjet head H pattern coats the organic EL material ink composition 1015 on the substrate by moving relatively to the substrate as shown by broken lines of FIG. 13.

At this time, the banks are formed up to the ends of the substrate (refer to FIG. 11). The formation of the banks up to the ends permits the banks to have surfaces with high flatness. Accordingly, ones of the electrodes (for example, cathodes) constituting the organic EL elements are not broken or no pinhole is formed. Further, when the substrate is sealed, a seal structure excellent in flatness is obtained because the substrate has high flatness over the entire surface thereof. That is, an approximately flat layer can be formed on the organic EL elements in a can seal in which the organic EL elements are sealed by a can structure, in an entire seal in which a resin is coated on the entire surfaces of the organic EL elements, and in an thin film seal in which thin films are laminated. Accordingly, in a top emission type of a device in which light emission is executed on a side opposite to the substrate, for example, a uniform display is obtained without optical difference over the entire surface of the substrate because the surface of the organic EL elements is flat over the entire surface of the substrate. If the thickness of the layer between the organic EL elements and the sealing substrate is not uniform, an uneven display is executed due the occurrence of an optical difference caused by the difference in a film thickness.

In the present invention, a bonding (sealing) resin can be formed flatly on the organic EL elements because a resin layer is formed over the entire surface of the substrate. Accordingly, no optical difference is caused in the sealing resin, so that no unevenness is caused in display characteristics.

Next, a specific example of electronic equipment including any one of the electrooptical devices 1-4 of the above first to fourth embodiments will be described. FIG. 14(a) is a perspective view showing an example of a mobile phone. In FIG. 14(a), reference numeral 700 denotes a mobile phone main body, and reference numeral 701 denotes a display unit using any one of the electrooptical devices 1-4.

FIG. 14(b) is a perspective view showing an example of a mobile information processing apparatus such as a word processor and a personal computer. In FIG. 14(b), reference numeral 800 denotes an information processing apparatus, reference numeral 801 denotes an input unit such as a keyboard, reference numeral 803 denotes an information processing apparatus main body, and reference numeral 802 denotes a display unit using any one of the electrooptical devices 1-4.

FIG. 14(c) is a perspective view showing an example of wrist watch type electronic equipment. In FIG. 14(c), reference numeral 900 denotes a watch main body, and reference numeral 901 denotes a display unit using any one of the electrooptical devices 1-4.

Since the electronic equipment shown in FIG. 14(a)-(c) includes the display unit using any one of the electrooptical devices 1-4, the manufacturing process thereof is simplified and the manufacturing cost thereof is reduced as well as the electronic equipment is provided with a display region whose area is increased or the electronic equipment is excellent in display quality and has an improved yield rate of nondefective products.

As described above in detail, according to the first color filter substrate of the present invention, since the resin layer having a light shielding property is formed on the approximately entire surface of the color filter non-forming region, in addition to the display region and further the alignment marks are composed of the resin material, the parting member, the light shielding layer, and the alignment marks are formed in one process. Accordingly, the manufacturing process of the electronic equipment is simplified by mounting the liquid crystal device including the first color filter substrate of the present invention thereon, thereby the manufacturing cost of the electronic equipment is reduced and the area of the display region of the electronic equipment is increased.

Further, according to the second color filter substrate of the present invention, the surface of the color filter substrate is more flattened than that of the conventional color filter substrate. This is because the colored portions constituting each color filter are formed by an inkjet system as well as the resin material, which partitions the portions where the colored portions are formed, is formed on the approximately entire surface of the color filter non-forming region when the colored portions are formed, in addition along the peripheries of the respective colored portions. Accordingly, the cell gaps are uniformly arranged and the liquid crystal device excellent in display quality is provided by arranging the liquid crystal device using the second color filter substrate of the present invention. Further, since the surface of the color filter substrate is more flattened than that of the conventional color filter substrate, the electrodes, the wirings, and the like formed on the color filters are prevented from being broken, thereby improving the yield rate of nondefective products. Further, since the alignment marks are composed of the resin material, the inter-pixel partition members and the alignment marks are formed in one process. Accordingly, the manufacturing process of the electronic equipment is simplified by mounting the liquid crystal device including the second color filter substrate of the present invention thereon, thereby the manufacturing cost of the electronic equipment is reduced and the area of the display region of the electronic equipment is increased.

Additionally, according to the electroluminescence substrate of the present invention, since the organic material banks and the alignment marks are composed of resin material, the organic material banks and the alignment marks are formed in the same process. Thus, the manufacturing process of the electronic equipment is simplified and the manufacturing cost thereof can be reduced by mounting the liquid crystal device including the electroluminescence substrate of the present invention thereon.

Further, the electrooptical device of the present invention can be provided by using the first or second color filter substrate or the electroluminescence substrate of the present invention. Further, the electronic equipment of the present invention may be provided by using the electrooptical device of the present invention. Then, according to the electrooptical device and the electronic equipment of the present invention, similar effects are obtained to those of the first or second color filter substrate and the electroluminescence substrate of the present invention.

What is claimed is:

1. An electrooptical device, comprising:
   a substrate having a light emitting region;
   a plurality of pixel electrodes formed in the light emitting region of the substrate;
   a common cathode formed above the pixel electrodes in the light emitting region of the substrate;
   electroluminescence elements formed in the light emitting region of the substrate by an ink jet method, each of the electroluminescence elements having a light emitting layer and being disposed between the common cathode and a corresponding pixel electrode of the plurality of pixel electrodes;
   a first resin film formed in the light emitting region so as to surround and define the peripheries of the light emitting layers;
   a second resin film formed in the light emitting region so as to overlap the first resin film and to surround and define the peripheries of the light emitting layers; and alignment marks formed of the same material of the first resin film outside of the light emitting region,
   the first resin film being formed of a material having an electric insulating property.

2. The electrooptical device according to claim 1, the electroluminescence elements being formed of an organic material.

3. Electronic equipment, comprising the electrooptical device according to claim 1.

* * * * *